United States Patent
Uenishi et al.

(10) Patent No.: US 6,897,004 B2
(45) Date of Patent: May 24, 2005

(54) INTERMEDIATE LAYER MATERIAL COMPOSITION FOR MULTILAYER RESIST PROCESS AND PATTERN FORMATION PROCESS USING THE SAME

(75) Inventors: Kazuya Uenishi, Shizuoka (JP); Kenichiro Sato, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/652,320

(22) Filed: Sep. 2, 2003

(65) Prior Publication Data

US 2004/0053162 A1 Mar. 18, 2004

(30) Foreign Application Priority Data

Sep. 2, 2002 (JP) .......................................... 2002-256737

(51) Int. Cl.[7] ........................... G03F 7/004; G03F 7/075
(52) U.S. Cl. ................... 430/270.1; 430/311; 430/330; 430/905; 430/913; 522/148; 522/172; 522/861
(58) Field of Search .............................. 430/270.1, 311, 430/330, 905, 913; 522/148, 172, 861

(56) References Cited

FOREIGN PATENT DOCUMENTS

| JP | 4-43264 | 7/1992 | |
|----|---------|--------|---|
| JP | 4-44741 | 7/1992 | |
| JP | 6-38400 | 5/1994 | |
| JP | 2573371 | 10/1996 | |
| JP | 2641644 | 5/1997 | |
| JP | 2901044 | 3/1999 | |
| WO | 02/073308 A1 * | 9/2002 | ........... G03C/1/725 |

* cited by examiner

*Primary Examiner*—Amanda Walke
(74) *Attorney, Agent, or Firm*—Sughrue Mion, PLLC

(57) ABSTRACT

The intermediate layer material composition for a multilayer resist process in the present invention, which is soluble in an organic solvent, excellent in storage stability, and has no problem with regard to a footing shape, a pattern separation and a line edge roughness in patterning an upper resist, and a pattern formation process using the intermediate layer material composition, in which the intermediate layer material composition for a multilayer resist process, comprises a polymer (component A) containing a repeating unit having on a side chain thereof a specific structure containing a silicon atom-oxygen atom bond, and the pattern formation process using the same.

31 Claims, No Drawings

INTERMEDIATE LAYER MATERIAL COMPOSITION FOR MULTILAYER RESIST PROCESS AND PATTERN FORMATION PROCESS USING THE SAME

FIELD OF THE INVENTION

The present invention relates to lithography technology by which a micro pattern is formed with a high degree of accuracy on a substrate in the fabrication of a semiconductor integrated circuit, and to an intermediate layer material composition for a multilayer resist process, particularly for a three-layer resist process and a pattern formation process using the same.

BACKGRAOUND OF THE INVENTION

With the progress of increased integration of semiconductor integrated circuits, resist patterns have been increasingly required to be miniaturized and raised in accuracy in lithography processes. In order to comply with this requirement, also in exposure methods, it has been intended to surely go ahead with the development of techniques for shortening the wavelengths of light sources toward the enhancement of resolution from the conventional near-ultraviolet lights such as g-rays and i-rays to excimer laser beams such as KrF, ArF and $F_2$, EUV lights and X-rays.

On the other hand, a lowering of the dimensional accuracy of resist patterns caused by fluctuations in resist film thickness based on differences in level of substrates which are developed in the fabrication of the semiconductor integrated circuits has occurred as a problem. This problem has been canalized to be alleviated by recent developments in CMP techniques of grinding substrates having differences in level to flatten them. Aside from this, a more serious problem has been encountered. Based on the shortened wavelengths of the exposure light sources, the light absorption of resist materials becomes increasingly strong, so that it becomes impossible to use conventional aromatic ring-based organic polymeric materials. Further, it has been needed that resist films are thinned, because of reduced light absorption and a widened process window of lithography. The situation has come in which conventional monolayer resist processes can no longer ensure sufficient dry etching resistance, thus making it impossible to process substrates with a high degree of accuracy.

As a solution for these problems, attention has been focused on a multilayer resist process, particularly a three-layer resist process.

The three-layer resist process includes the following processes:

(a) A lower resist layer comprising an organic material is formed on a substrate to be processed;

(b) An intermediate layer and an upper resist layer comprising an organic material crosslinkable or decomposable by radiation exposure are successively laminated on the lower resist layer; and (c) After the formation of a specified pattern on the upper resist layer, the intermediate layer, the lower layer and the substrate are successively etched.

The intermediate layer means a layer having the function of pattern transferring the pattern of the upper layer to the lower layer by the etching process and provided between the upper layer resit and the lower layer resit. This makes it possible to pattern transfer the pattern of the upper layer to the lower layer using the intermediate layer as a mask mainly by a dry etching method to obtain a lower layer pattern of a high aspect ratio.

As a material for the intermediate layer used herein, an organopolysiloxane (silicone resin) or a $SiO_2$ coating solution (SOG) has hitherto been known.

There are further reported an improved organopolysiloxane material (JP-B-4-43264 (the term "JP-B" as used herein means an "examined Japanese patent publication")), an intermediate layer material using a silicon compound such as $Si(OH)_4$ (JP-B-6-38400), an intermediate layer material comprising a silylated product of a clay mineral (patent document 3: Japanese Patent No. 2,573,371), an intermediate layer material comprising a mixture of a halogenosilane or a an organohalogenosilane and ammonia or an amine (Japanese Patent No. 2,641,644), an intermediate layer material comprising a polysiloxane derivative (Japanese Patent No. 2,901,044) and an intermediate layer material comprising an organopoly-silsesquioxane (JP-B-4-44741).

However, these intermediate layer materials are essentially poor in storage stability. Further, separation of upper layer patterns occurs, and upper layer resist patterns formed on the intermediate layers take a footing shape. Accordingly, they have the critical problem that line edge roughness (LER) is deteriorated when the intermediate layers are etched using the upper layer resist patterns as masks.

SUMMARY OF THE INVENTION

An object of the invention is to provide an intermediate layer material for a multilayer resist process which overcomes the problems of the related art, and more particularly to provide an intermediate layer material composition for a multilayer resist process which is soluble in an organic solvent, excellent in storage stability, and has no problem with regard to a footing shape, pattern separation and line edge roughness in patterning an upper resist. Anther object of the invention is to provide a pattern formation method using the intermediate layer material composition.

As a result of intensive studies made while giving attention to the above-mentioned characteristics, the present inventors have completed the invention. That is to say, the objects of the invention can be attained by the following constitutions.

1. An intermediate layer material composition for a multilayer resist process, comprising (A) a polymer containing a repeating unit having on a side chain thereof a group represented by the following general formula (A-I):

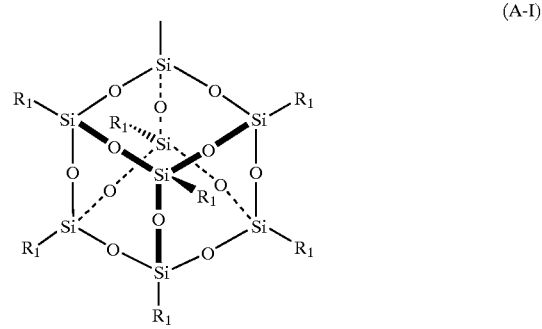

(A-I)

wherein $R_1$ represents an alkyl group, an alkoxyl group, an aryl group, an aralkyl group, a cyclopentyl group or a cyclohexyl group; a plurality of $R_1$'s each may be the same or different.

2. The intermediate layer material composition described in the item 1, wherein the polymer is a polymer having at least one of repeating units represented by the following general formulas (a-1) to (a-4):

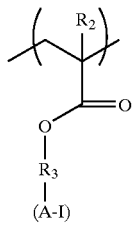
(a-1)
(A-I)

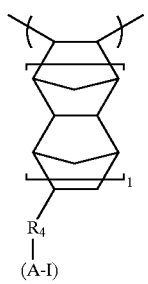
(a-2)
(A-I)

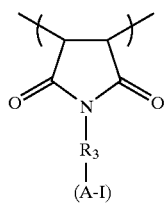
(a-3)
(A-I)

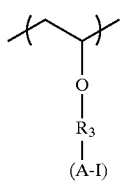
(a-4)
(A-I)

wherein (A-I) represents the group represented by the general formula (A-I) described in item 1; $R_2$ represents a hydrogen atom or a methyl group; $R_3$ represents an alkylene group or a phenylene group; $R_4$ represents an alkylene group, a phenylene group or —C(=O)—O—R'—; R' represents an alkylene group.

3. The intermediate layer material composition described in the item 1 or 2, wherein the polymer further contains at least one of a repeating unit represented by the following general formula (A-II) and a repeating unit represented by the following general formula (A-III):

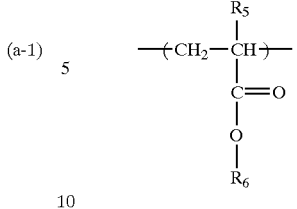
(A-II)
(A-III)

wherein $R_5$ represents a hydrogen atom or a methyl group; $R_6$ represents an aryl group or an aralkyl group.

4. The intermediate layer material composition described in any one of the items 1 to 3, wherein the polymer contains the repeating unit having on a side chain thereof the group represented by the following general formula (A-I) in an amount of 3 to 90 mol %.

5. The intermediate layer material composition described in any one of the items 1 to 4, which further comprises (B) a crosslinking agent.

6. The intermediate layer material composition described in the item 5, wherein the crosslinking agent (B) is a phenol derivative having a molecular weight of 1,200 or less, containing 3 to 5 benzene rings in its molecule, and having 2 or more hydroxymethyl groups or alkoxymethyl groups in total, wherein the hydroxymethyl groups or alkoxymethyl groups bind to the benzene rings.

7. The intermediate layer material composition described in any one of items 1 to 6, which further comprises (C) a compound capable of generating an acid by heat.

8. The intermediate layer material composition described in the items 1 to 7, which further comprises (D) a solvent.

9. The intermediate layer material composition described in the items 1 to 8, which further comprises (E) a surfactant.

10. A process for forming a resist pattern, which comprises:
forming on a substrate a lower resist layer comprising an organic material;
forming on the lower resist layer an intermediate layer using the intermediate layer material composition described in any one of the items 1 to 9;
forming on the intermediate layer an upper resist layer comprising an organic material crosslinkable or decomposable by a radiation exposure;
forming a predetermined pattern on the upper resist layer; and
etching the intermediate layer, the lower resist layer and the substrate, sequentially.

11. The process described in the item 10, wherein the intermediate layer is formed by coating the intermediate layer material composition described in item 1 on the lower resist layer, and then baking the coating to be insolubilized in an organic solvent.

12. The process described in the item 11, wherein the coating is baked at a temperture of 150 to 250° C.

13. The process described in the item 10, wherein the lower resist layer has a thickness of 0.1 to 4.0 μm.

14. The process described in the item 10, wherein the intermediate layer has a thickness of 0.02 to 0.6 μm.

15. The process described in the item 10, wherein the upper layer has a thickness of 0.03 to 0.6 μm.

DETAILED DESCRIPTION OF THE INVENTION

Embodiments of the invention will be explained below, but are not intended as limiting the scope of the invention.

(1) Polymer of Component a Used in the Invention

The polymer of component A used in the composition of the invention contains a group represented by general formula (A-I).

$R_1$ in general formula (A-I) represents an alkyl group, an alkoxyl group, an aryl group, an aralkyl group, a cyclopentyl group or a cyclohexyl group. It is preferred that these groups have 20 or less carbon atoms.

The alkyl groups include a straight-chain or branched alkyl group, and examples thereof include a methyl group, an ethyl group, a propyl group, a butyl group, a pentyl group, a hexyl group, an octyl group, a nonyl group, a dodecyl group, a hexadecyl group and an octadecyl group.

The alkoxyl groups include a straight-chain or branched alkoxyl group, and examples thereof include a methoxy group, an ethoxy group, a propoxy group, a butoxy group, a pentyloxy group, a hexyloxy group, an octyloxy group, a nonyloxy group and a hexadecyloxy group.

The alkyl group or alkoxyl group as $R_1$ may be further substituted by a halogen tom, a nitrile group, an amino group or a nitro group.

The aryl groups as $R_1$ include a phenyl group, a tolyl group, a xylyl group, a biphenyl group, a naphthyl group, an anthryl group and a phenanthryl group.

The aralkyl groups as $R_1$ include a benzyl group, a phenylethyl group, a methylbenzyl group and a naphthylmethyl group.

The aryl group or aralkyl group as $R_1$ may be further substituted by an alkyl group, a halogen tom, a nitrile group, an amino group or a nitro group.

It is preferred that $R_1$ has 20 or less carbon atoms.

The composition of the invention contains the polymer having the group represented by general formula (A-I), and it is preferred that such a polymer has at least any one of repeating units represented by the following general formulas (a-1) to (a-4)

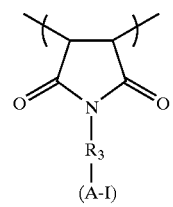
(a-1)

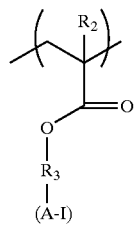
(a-2)

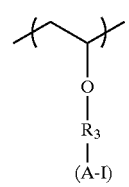
(a-3)

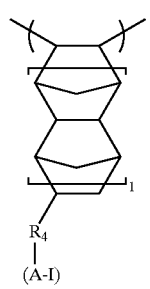
(a-4)

In the above-mentioned general formulas (a-1) to (a-4), (A-I) represents the group represented by the above-mentioned general formula (A-I).

$R_2$ represents a hydrogen atom or a methyl group.

$R_3$ represents an alkylene group (preferably having 1 to 20 carbon atoms) or a phenylene group. The alkylene groups include a methylene group, an ethylene group, a propylene group, a butylene group, a pentylene group, a hexylene group and an octylene group, and a methylene group, an ethylene group, a propylene group and a butylene group are preferred among others. $R_4$ represents an alkylene group (preferably having 1 to 20 carbon atoms, specific examples are the same as with $R_3$), a phenylene group or —C(=O)—O—R'—, and —C(=O)—O—R'— is preferred. R' as used herein represents an alkylene group, which is preferably an alkylene group having 1 to 4 carbon atoms, and particularly preferably a methylene group, an ethylene group or a propylene group.

The composition of the invention comprises a polymer containing repeating units having a group represented by general formula (A-I), and it is preferred that such a polymer contains at least any one of repeating units represented by the following general formulas (A-II) and (A-III):

(A-II)

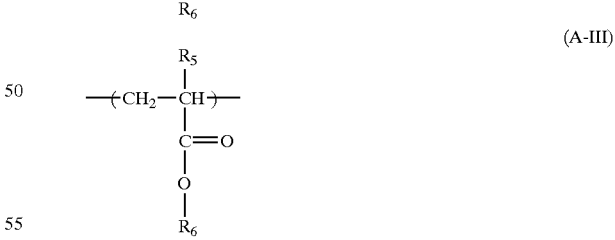
(A-III)

$R_5$ represents a hydrogen atom or a methyl group. $R_6$ represents an aryl group or an aralkyl group.

The aryl group or aralkyl group as $R_6$ has preferably 20 or less carbon atoms, and particularly preferably 6 to 20 carbon atoms.

The aryl group or aralkyl group as $R_6$ includes one having a substituent group.

The aryl groups as $R_6$ include a phenyl group, a tolyl group, a xylyl group, a biphenyl group, a naphthyl group, an anthryl and a phenanthryl group.

The aralkyl groups as $R_6$ include a benzyl group, a phenylethyl group, a methylbenzyl group, a naphthylmethyl group, an anthrylmethyl group and a phenanthrylmethyl group.

The substituent groups which the aryl group or aralkyl group as $R_6$ may have include a hydroxyl group, an alkyl group, an alkoxyl group, an acyl group, an acyloxy group, a halogen atom, a nitrile group, an amino group and a nitro group.

It is preferred that the alkyl group as the substituent group has 1 to 20 carbon atoms, and examples thereof include a methyl group, an ethyl group, a propyl group, a butyl group, a pentyl group, a hexyl group, an octyl group, a nonyl group, a dodecyl group, a hexadecyl group and an octadecyl group.

The alkoxyl group preferably has 1 to 20 carbon atoms, and examples thereof include a methoxy group, an ethoxy group, a propoxy group, a butoxy group, a pentyloxy group, a hexyloxy group, an octyloxy group, a nonyloxy group and a hexadecyloxy group.

The acyl group preferably has 2 to 20 carbon atoms, and examples thereof include an acetyl group, a propionyl group, a butyryl group and a valeryl group.

As the acyloxy groups, acyloxy groups corresponding to the above-mentioned acyl groups can be exemplified.

The halogen atoms include a chlorine atom and a bromine atom.

It is preferred that the aryl group or aralkyl group as $R_6$ has at least one hydroxyl group or alkoxyl group as the substituent group.

The content of the repeating units having the group represented by general formula (A-I) or the repeating units represented by general formula (A-II) or (A-III) used in component (A) of the invention can be appropriately established, taking in consideration various resist performances such as plasma etching resistance and substrate adhesion.

The content of the repeating units having the group represented by general formula (A-I) is generally from 3 to 90 mol %, preferably from 5 to 65 mol %, and more preferably from 10 to 55 mol %.

The preferred content of the other repeating units is exemplified bellow. The content of the repeating units represented by general formula (A-II) is generally from 3 to 55 mol %, and more preferably from 5 to 40 mol %. The content of the repeating units represented by general formula (A-III) is generally from 4 to 45 mol %, and more preferably from 10 to 35 mol %.

The polymer of component (A) used in the invention may be a copolymer containing other repeating units in order to improve film forming properties and adhesion, as well as the repeating units having the group represented by general formula (A-I) and the repeating units represented by general formula (A-II) and (A-III).

Monomers corresponding to such other repeating units include, for example, a compound having one addition—polymerizable unsaturated bond, which is selected from an acrylate, a methacrylate, an acrylamide, a methacrylamide, an allyl compound, a vinyl ether and a vinyl ester.

Specific examples of such compounds include an acrylate such as an alkyl (the carbon atom number of the alkyl group is preferably from 1 to 10) acrylate (for example, methyl acrylate, ethyl acrylate, propyl acrylate, amyl acrylate, cyclohexyl acrylate, ethylhexyl acrylate, octyl acrylate, t-octyl acrylate, chloroethyl acrylate, trimethylolpropane monoacrylate, pentaerythritol monoacrylate, benzyl acrylate, methoxybenzyl acrylate, furfuryl acrylate or tetrahydrofurfuryl acrylate);

a methacrylate such as an alkyl (the carbon atom number of the alkyl group is preferably from 1 to 10) methacrylate (for example, methyl methacrylate, ethyl methacrylate, propyl methacrylate, isopropylmethacrylate, amyl methacrylate, hexyl methacrylate, cyclohexyl methacrylate, benzyl methacrylate, chlorobenzyl methacrylate, octyl methacrylate, trimethylolpropane monomethacrylate, pentaerythritol monomethacrylate, furfuryl methacrylate or tetrahydrofurfuryl methacrylate);

an acrylamide such as acrylamide, an N-alkylacrylamide (the alkyl group is one having 1 to 10 carbon atoms, which is, for example, a methyl group, an ethyl group, a propyl group, a butyl group, a t-butyl group, a heptyl group, an octyl group, a cyclohexyl group or a hydroxyethyl group), an N,N-dialkylacrylamide (the alkyl group is one having 1 to 10 carbon atoms, which is, for example, a methyl group, an ethyl group, a butyl group, an isobutyl group, an ethylhexyl group or a cyclohexyl group), N-hydroxyethyl-N-methylacrylamide or N-2-acetamidoethyl-N-acetylacrylamide;

a methacrylamide such as methacrylamide, an N-alkylmethacrylamide (the alkyl group is one having 1 to 10 carbon atoms, which is, for example, a methyl group, an ethyl group, a t-butyl group, an ethylhexyl group, a hydroxyethyl group or a cyclohexyl group), an N,N-dialkylmethacrylamide (the alkyl group is an ethyl group, a propyl group or a butyl group) or N-hydroxyethyl-N-methylmethacrylamide;

an allyl compound such as an allyl ester (for example, allyl acetate, allyl caprylate, allyl laurate, allyl palmitate, allyl stearate, allyl benzoate, allyl acetoacetate or allyl lactate) or allyloxyethanol;

a vinyl ether such as an alkyl vinyl ether (for example, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether or tetrahydrofurfuryl vinyl ether);

a vinyl ester such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate or vinyl cyclohexyl-carboxylate;

a dialkyl itaconate (for example, dimethyl itaconate, diethyl itaconate or dibutyl itaconate); a dialkyl ester of fumaric acid (for example, dibutyl fumarate) or a monoalkyl eater thereof; acrylic acid, methacrylic acid, crotonic acid, itaconic acid, maleic anhydride, maleimide, acrylonitrile, methacrylonitrile and maleonitrile.

In addition, an addition-polymerizable unsaturated compound copolymerizable with the above-mentioned various repeating units may be used.

Although there is no particular limitation on the weight average molecular weight of the polymer of component (A), it is preferably from 1,000 to 100,000, and more preferably from 2,000 to 50,000, from the viewpoints of compatibility with other components, organic solvent properties and film forming properties.

Further, the polymers of component (A) used in the invention may be used either alone or as a mixture of two or more of them. The amount of the polymer of component (A) used is from 40% to 99% by weight, and preferably from 60% to 98% by weight, based on the total weight of the composition (excluding the solvent).

A monomer for the repeating units having the group represented by general formula (A-I) can be synthesized by methods described in *Macromolecules*, 28, 8435–8437 (1995) and *J. Am. Chem. Soc.,* 112, 1931 (1990), and the polymer of component (A) can be synthesized by ordinary radical polymerization. In the following, n is a positive number.

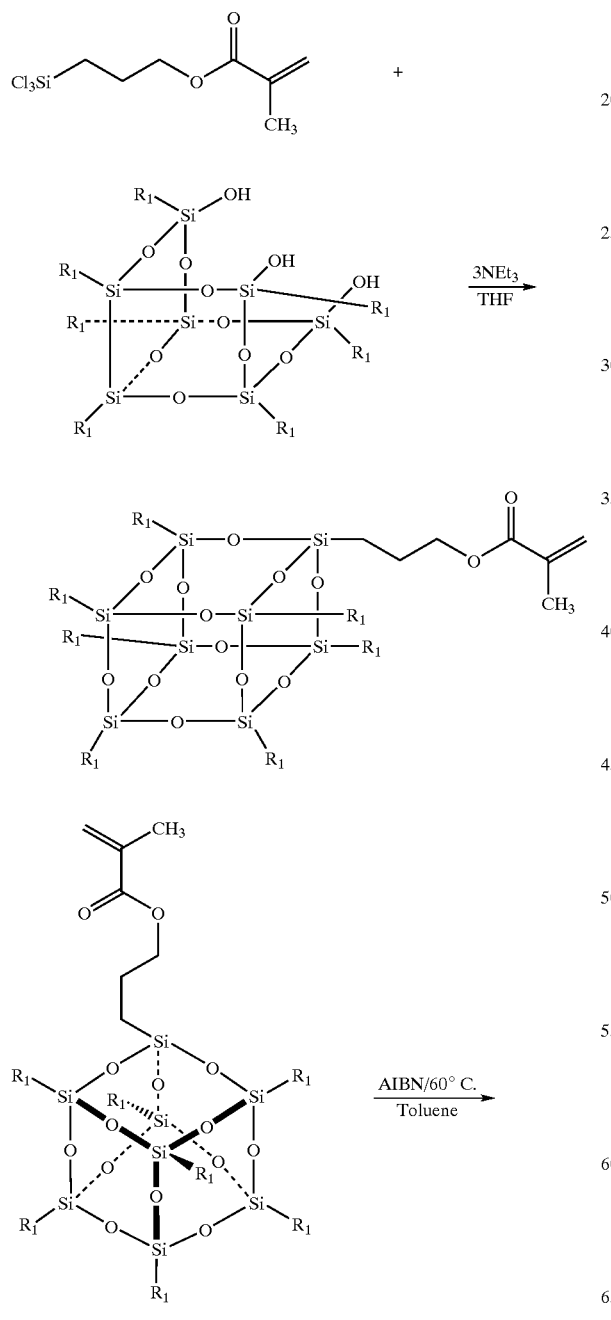

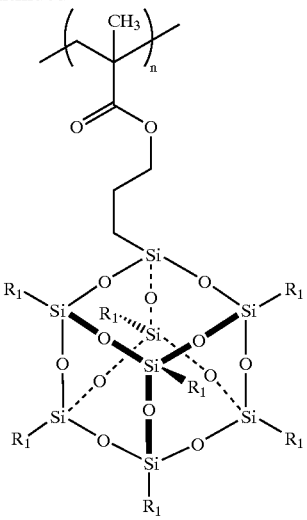

Specific examples of the polymers of component (A) used in the invention include but are not limited to the following. The number in parentheses indicates a molar fraction.

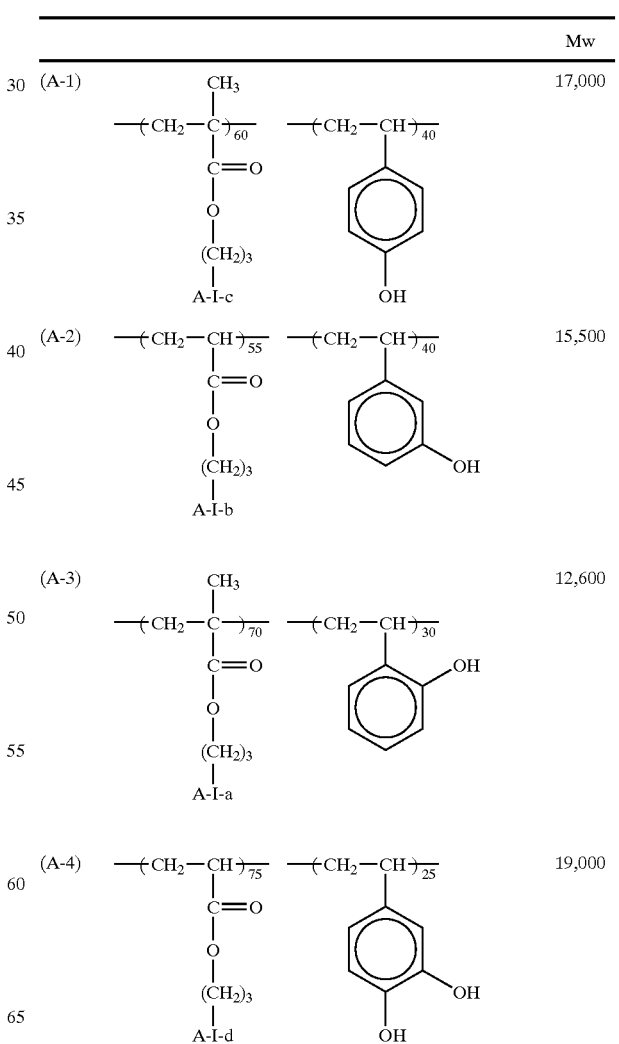

-continued

| | | Mw |
|---|---|---|
| (A-5) | copolymer with A-I-e (65) and p-methoxybenzyl (35) | 22,700 |
| (A-6) | copolymer with A-I-f (80) and m-methoxybenzyl (20) | 10,500 |
| (A-7) | copolymer with A-I-g (50) and 3-methoxy-4-hydroxybenzyl (50) | 24,700 |
| (A-8) | copolymer with A-I-c (85) and 3,4-dimethoxybenzyl (15) | 16,300 |
| (A-9) | copolymer with A-I-a (70) and 4-methoxynaphthyl (30) | 12,100 |
| (A-10) | copolymer with A-I-g (75) and 4-methoxynaphthyl (25) | 14,500 |
| (A-11) | copolymer with A-I-b (60) and hydroxyanthryl (40) | 13,600 |

-continued

| | | Mw |
|---|---|---|
| (A-12) | copolymer with A-I-c (55) and 4-hydroxybenzyl ester (45) | 19,100 |
| (A-13) | copolymer with A-I-e (80) and 4-methoxyphenethyl methacrylate (20) | 15,200 |
| (A-14) | copolymer with A-I-h (75) and 4-hydroxynaphthyl ethyl ester (25) | 13,000 |
| (A-15) | copolymer with A-I-d (65) and methoxyanthryl ethyl methacrylate (35) | 14,100 |

-continued

| | | Mw |
|---|---|---|
| (A-16) | 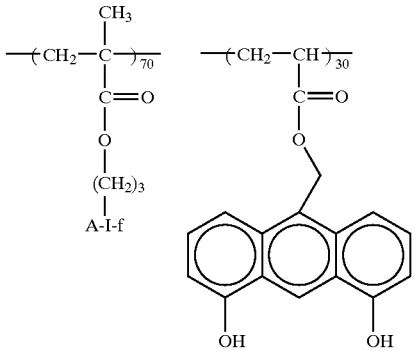 | 9,200 |

A-I-a to A-I-h each represents a group represented by general formula (A-I) in which $R_1$ is a group shown below:

A-I-a; cyclopentyl
A-I-b; ethyl
A-I-c; i-butyl
A-I-d; i-octyl
A-I-e; phenyl
A-I-f; cyclohexyl
A-I-g; methyl
A-I-h; phenetyl (2) Crosslinking Agents (Component B) Used in the Invention The intermediate layer material composition of the invention can contain a compound which is crosslinked with an acid (hereinafter referred to appropriately as an acid crosslinking agent, or simply as a crosslinking agent).

(2)-1 Phenol derivatives can be used as the crosslinking agents. Preferably, they include a phenol derivative having a molecular weight of 1,200 or less, containing 3 to 5 benzene rings in its molecule, and having 2 or more hydroxymethyl groups or alkoxymethyl groups in total, wherein the hydroxymethyl groups or alkoxymethyl groups are bonded collectively to at least any one of the benzene rings, or distributively to the benzene rings. The use of such phenol derivatives allows the effect of the invention to become more significant.

The alkoxymethyl group bonded to the benzene ring is preferably an alkoxymethyl group having 6 or less carbon atoms. Specifically, preferred are a methoxymethyl group, an ethoxymethyl group, a n-propoxymethyl group, an i-propoxymethyl group, a n-butoxymethyl group, an i-butoxymethyl group, a sec-butoxymethyl group and a t-butoxymethyl group. Further, an alkoxy-substituted alkoxyl group such as a 2-methoxyethoxy group or a 2-methoxy-1-propyl group is also preferred.

Further, the molecular weight thereof is preferably from 250 to 1,000, and particularly preferably from 250 to 800.

Of these phenol derivatives, particularly preferred ones are enumerated below:

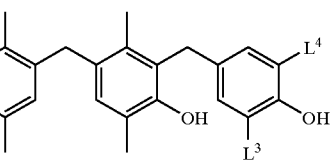

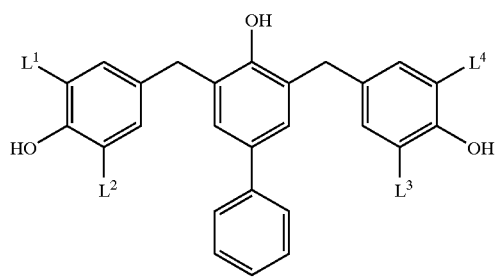

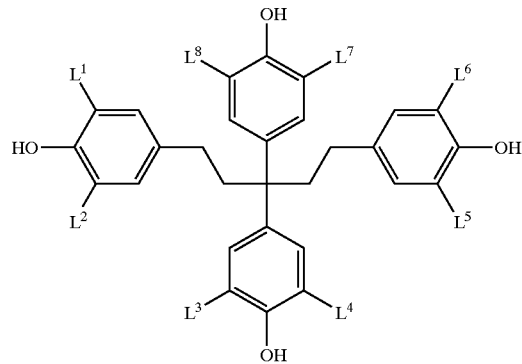

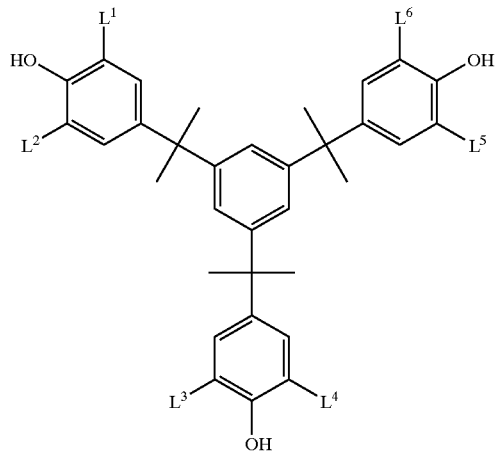

-continued
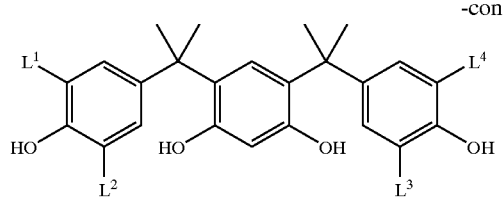
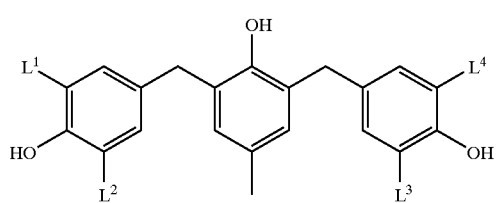
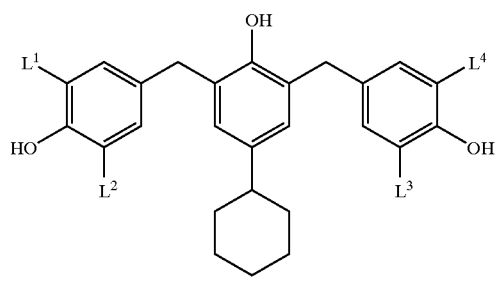
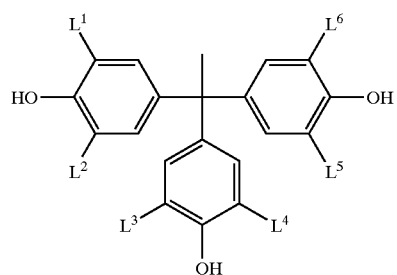
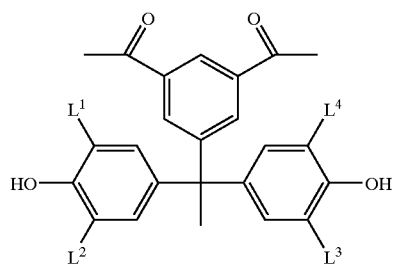
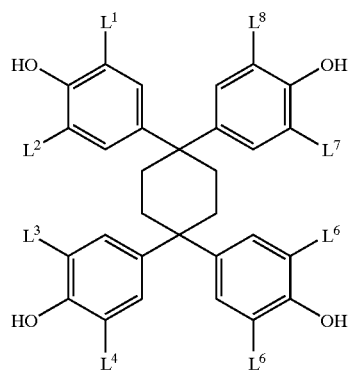
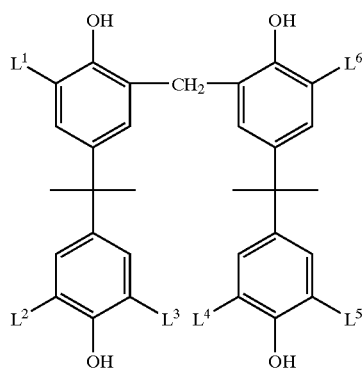
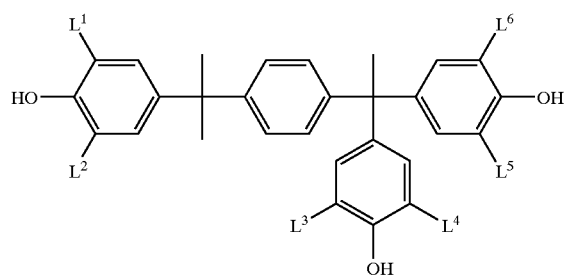
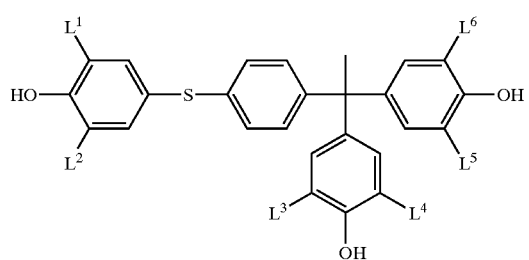
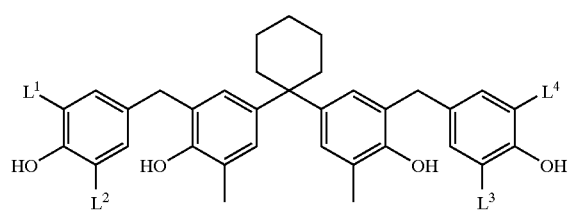

-continued

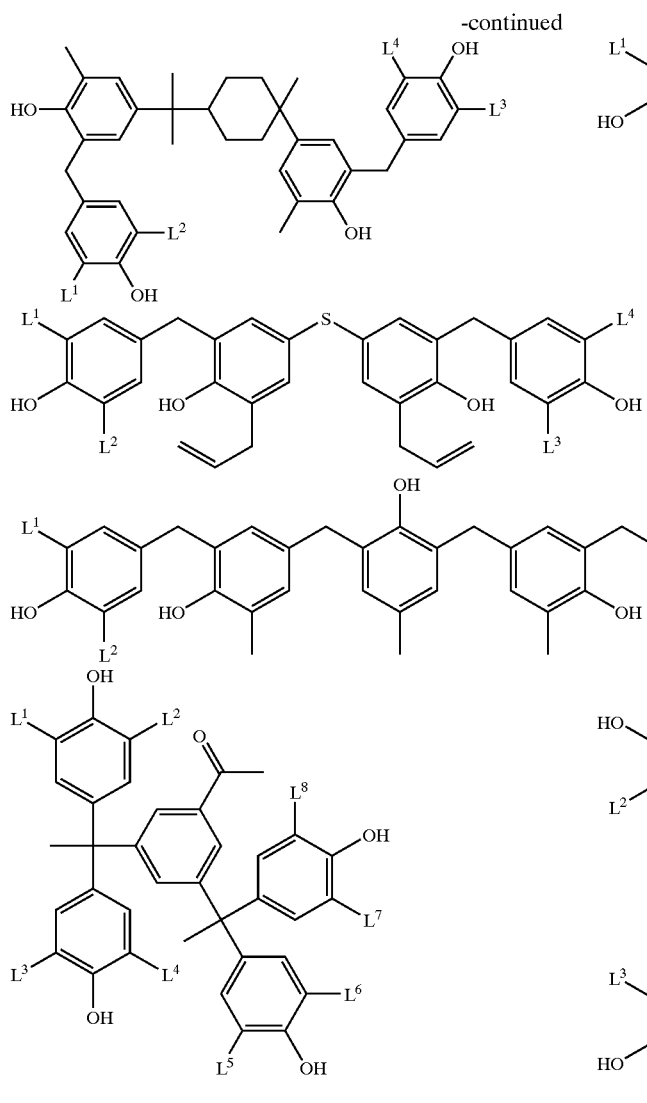
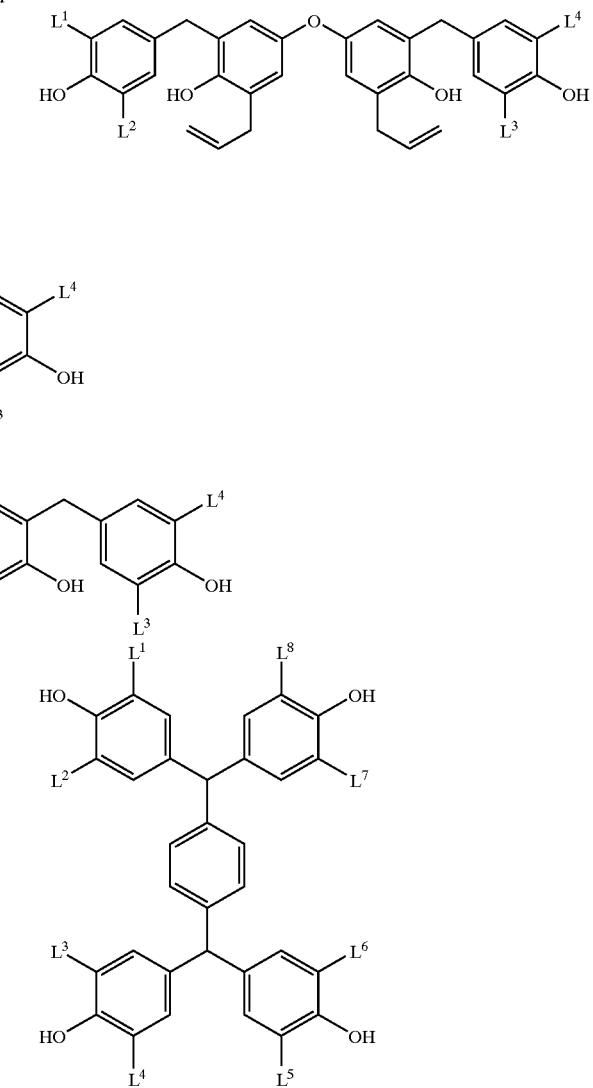

wherein $L^1$ to $L^8$, which may be the same or different, each represents a hydroxymethyl group, a methoxymethyl group or an ethoxymethyl group.

The hydroxymethyl group-containing phenol derivatives can be obtained by reacting phenol compounds having no corresponding hydroxymethyl groups (compounds in which $L^1$ to $L^8$ are hydrogen atoms in the above-mentioned formulas) with formaldehyde in the presence of base catalysts. In this case, in order to prevent resinification and gelation, it is preferred that the reaction is conducted at a reaction temperature of 60° C. or less. Specifically, the derivatives can be synthesized by methods described in JP-A-6-282067 and JP-A-7-64285.

The alkoxymethyl group-containing phenol derivatives can be obtained by reacting phenol compounds having corresponding hydroxymethyl groups with alcohols in the presence of acid catalysts. In this case, in order to prevent resinification and gelation, it is preferred that the reaction is conducted at a reaction temperature of 100° C. or less. Specifically, the derivatives can be synthesized by methods described in EP-A-632,003 (the term "EP-A" as used herein means an "unexamined published European patent application").

Although the hydroxymethyl group- or alkoxymethyl group-containing phenol derivatives thus synthesized are preferred in respect to stability in storage, the alkoxymethyl group-containing phenol derivatives are particularly preferred from the viewpoint of stability in storage.

The phenol derivatives each having 2 or more hydroxymethyl groups or alkoxymethyl groups in total, wherein the hydroxymethyl groups or alkoxymethyl groups are bonded collectively to any one of the benzene rings, or distributively to the benzene rings, may be used either alone or as a combination of two or more of them.

(2)-2 In addition to the above-mentioned phenol derivative, a compound of the following (i) or (ii) can be used as the crosslinking agent:

(i) A compound having an N-hydroxymethyl group, an N-alkoxymethyl group or an N-acyloxymethyl group; and (ii) An epoxy compound.

These crosslinking agents will be described in detail below.

(i) The compounds each having an N-hydroxymethyl group, an N-alkoxymethyl group or an N-acyloxymethyl group include monomers, oligomer-melamine-formaldehyde condensation products and ureaformaldehyde condensation products disclosed in EP-A-0, 133,216, West German Patents 3,634,671 and 3,711,265, and benzoguanamine-formaldehyde condensation products and an alkoxyl-substituted compound disclosed in EP-A-0, 212,482.

Further, a glycol uryl derivative represented by the following general formula can be used:

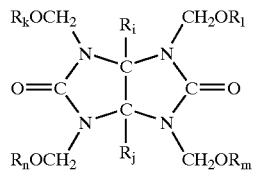

wherein $R_i$ and $R_j$ each independently represents a hydrogen atom or an alkyl group having 1 to 4 carbon atoms, and $R_k$ to $R_n$ each independently represents a hydrogen atom, a methyl group or an ethyl group.

More preferred examples thereof include, for example, a melamine-formaldehyde derivative having at least two free N-hydroxymethyl groups, N-alkoxymethyl groups or N-acyl-oxyethyl groups. An N-alkoxymethyl derivative is particularly preferred among others.

(ii) The epoxy compounds include a monomer, a dimer, an oligomer and a polymeric epoxy compound, each having one or more epoxy groups. They include, for example, a reaction product of bisphenol A with epichlorohydrin, and a reaction product of a low molecular weight phenol-formaldehyde resin with epichlorohydrin. In addition, they include epoxy resins described in U.S. Pat. No. 4,026,705 and British Patent 1,539,192, and used.

In the invention, the above-mentioned phenol derivatives are preferred.

In addition to the above-mentioned phenol derivative, for example, the other crosslinking agent (i) or (ii) as described above can be used in combination. The ratio of the other crosslinking agent usable in combination to the above-mentioned phenol derivative is from 100/0 to 20/80, preferably from 90/10 to 40/60, and more preferably from 80/20 to 50/50, by the molar ratio.

The crosslinking agent is used in an amount of 3% to 70% by weight, and preferably in an amount added of 5% to 50% by weight, based on the solid content of the intermediate layer material composition. When the amount of the crosslinking agent added is less than 3% by weight, the residual film rate is decreased. On the other hand, exceeding 70% by weight results in unfavorable stability of the intermediate layer material composition.

(3) Compounds Capable of Generating an Acid by Heat (Component (C))

The intermediate layer material composition of the invention can contain a compound decomposed by heat to generate an acid (hereinafter appropriately referred to as an acid generating agent).

In the invention, the acid generating agent means a compound which generates an acid by heating at a temperature of 100° C. or more. The acid generating agents suitably used in the invention include known compounds which generate acids by heat decomposition, such as a photoinitiator for cationic photopolymerization, a photoinitiator for radical photopolymerization, a photodecoloring agent and photodiscoloring agent for dyes, and a know acid generating agent used in micro resists, and mixtures thereof. They can be appropriately selected to use.

The acid generating agents include, for example, onium salts such as diazonium salts described in S. I. Schlesinger, *Photogr. Sci. Eng.*, 18, 387 (1974) and T. S. Balet al., *Polymer,* 21, 423 (1980), ammonium salts described in U.S. Pat. Nos. 4,069,055, 4,069,056 and Re 27,992, and JP-A-4-365049, phosphonium salts described in D. C. Necker et al., *Macromolecules,* 17, 2468 (1984), C. S. Wen et al., *Teh. Proc. Conf. Rad. Curing ASIA,* p. 478, Tokyo, October (1988), U.S. Pat. Nos. 4,069,055 and 4,069,056, iodonium salts described in J. V. Crivello et al., *Macromolecules,* 10 (6), 1307 (1977), *Chem. & Eng. News,* Nov. 28, 31 (1988), European Patents 104,143, 339,049 and 410,201, JP-A-2-150848 and JP-A-2-296514, sulfonium salts described in J. V. Crivello et al., *Polymer, J.* 17, 73 (1985), J. V. Crivello et al., *J. Org. Chem.,* 43, 3055 (1978), W. R. Watt et al., *J. Polymer Sci., Polymer Chem. Ed.,* 22, 1789 (1984), J. V. Crivello et al., *Polymer Bull.,* 14, 279 (1985), J. V. Crivello et al., *Macromolecules,* 14 (5), 1141 (1981), J. V. Crivello et al., *J. Polymer Sci., Polymer Chem. Ed.,* 17, 2877 (1979), European Patents 370,693, 390,214, 233,567, 297,443, 297, 442, 161,811, 410,201 and 339,049, U.S. Pat. Nos. 4,933, 377, 4,760,013, 4,734,444 and 2,833,827, German Patents 2,904,626, 3,604,580 and 3,604,581, selenonium salts described in J. V. Crivello et al., *Macromolecules,* 10 (6), 1307 (1977) and J. V. Crivello et al., *J. Polymer Sci., Polymer Chem. Ed.,* 17, 1047 (1979) and arsonium salts described in C. S. Wen et al., *Teh. Proc. Conf. Rad. Curing ASIA,* p. 478, Tokyo, October (1988); organic halogen compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; organic metals/organic halides described in K. Meier et al., *J. Rad. Curing,* 13 (4), 26 (1986), T. P. Gill et al., *Inorg. Chem.,* 19, 3007 (1980), D. Astruc, *Acc. Chem. Res.,* 19 (12), 377 (1896) and JP-A-2-161445, photoacid generating agents having o-nitrobenzyl type protecting groups described in S. Hayase et al.,*J. Polymer Sci.,* 25, 753 (1987), E. Reichmanis et al.,*J. Polymer Sci., Polymer Chem. Ed.,* 23, 1 (1985), Q. Q. Zhu et al.,*J. Photochem.,* 36, 85, 39, 317 (1987), B. Amit et al., *Tetrahedron Lett., (*24), 2205 (1973), D. H. R. Barton et al., *J. Chem. Soc.,* 3571 (1965), P. M. Collins et al., *J. Chem. Soc.,* Perkin I, 1695 (1975), M. Rudinstein et al., *Tetrahedron Lett.,* (17), 1445 (1975), J. W. Walker et al., *J. Am. Chem. Soc.,* 110, 7170 (1988), S. C. Busman et al., *J. Imaging Technol.,* 11 (4), 191 (1985), H. M. Houlihan et al., *Macromolecules,* 21, 2001 (1988), P. M. Collins et al., *J. Chem. Soc., Chem. Commun.,* 532 (1972), S. Hayase et al., *Macromolecules,* 18, 1799 (1985), E. Reichmanis et al., *J. Electrochem. Soc., Solid State Sci. Technol.,* 130 (6), F. M. Houlihan et al.,*Macromolecules,* 21, 2001 (1988), European Patents 0290,750, 046,083, 156,535, 271,851 and 0,388, 343, U.S. Pat. Nos. 3,901,710 and 4,181,531, JP-A-60-198538 and JP-A-53-133022; compounds producing sulfonic acids by photolysis which are represented by iminosulfonates described in M. Tunooka et al., *Polymer Preprints Japan,* 38 (8), G. Berner et al., *J. Rad. Curing,* 13 (4), W. J. Mijs et al., *Coating Technol.,* 55 (697), 45 (1983), Akzo, H. Adachi et al., *Polymer Preprints Japan,* 37 (3), European Patents 0199,672, 84,515, 199,672, 044,115 and 0101,122, U.S. Pat. Nos. 4,618,564, 4,371,605 and 4,431, 774, JP-A-64-18143, JP-A-2-245756 and Japanese Patent Application No. 3-140109; and disulfone compounds described in JP-A-61-166544.

Further, compounds in which these acid generating groups or compounds are introduced into their main chains or side chains can be used. Examples of such compounds are described in M. E. Woodhouse et al.,*J. Am. Chem. Soc.,* 104, 5586 (1982), S. P. Pappas et al., *J. Imaging Sci.,* 30 (5), 218

(1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146037, JP-A-63-163452, JP-A-62-153853 and JP-A-63-146029.

Further, compounds generating acids with light can also be used which are described in V. N. R. Pillai, *Synthesis*, (1) 1 (1980), A. Abad et al., *Tetrahedron Lett.*, (47), 4555 (1971), D. H. R. Barton et al., *J. Chem. Soc.*, (C), 329 (1970), U.S. Pat. No. 3,779,778 and European Patent 126, 712.

Of these, the acid generating agents preferably used in the invention include compounds represented by the following general formulas (I) to (V):

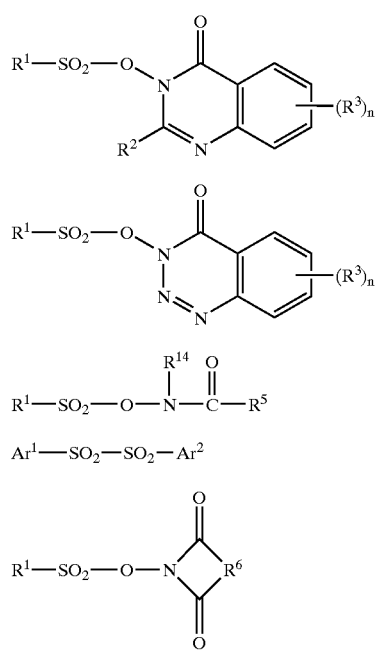

wherein $R^1$, $R^2$, $R^4$ and $R^5$, which may be the same or different, each represents a hydrocarbon group having 20 or less carbon atoms, which may have a substituent group; $R^3$ represents a halogen atom, a hydrocarbon group having 10 or less carbon atoms, which may have a substituent group, or an alkoxyl group having 10 or less carbon atoms; $Ar^1$ and $Ar^2$, which may be the same or different, each represents an aryl group having 20 or less carbon atoms, which may have a substituent group; $R^6$ represents a bivalent hydrocarbon group having 20 or less carbon atoms, which may have a substituent group; and n represents an integer of 0 to 4.

In the above-mentioned general formulas (I) to (V), $R^1$, $R^2$, $R^4$ and $R^5$ each independently represents a hydrocarbon group having 20 or less carbon atoms, which may have a substituent group, and preferably represents a hydrocarbon group having 1 to 14 carbon atoms.

Specific examples of the hydrocarbon groups include alkyl groups such as a methyl group, an ethyl group, a n-propyl group, an i-propyl group, a n-butyl group, a sec-butyl group, a t-butyl group, a hexyl group, a cyclohexyl group, an octyl group, a 2-ethylhexyl group, a undecyl group and a dodecyl group; alkenyl groups such as an allyl group, a vinyl group, a 1-methylvinyl group and a 2-phenylvinyl group; aralkyl groups such as a benzyl group; and aryl groups such as a phenyl group, a tolyl group, a xylyl group, a cumenyl group, a mesityl group, a dodecylphenyl group, a phenylphenyl group, a naphthyl group and an anthracenyl group.

These hydrocarbon groups may each have a substituent group such as a halogen atom, an alkoxyl group, a nitro group, a cyano group or a carboxyl group. Specific examples of the substituent group-containing hydrocarbon groups include a trifluoromethyl group, a chloroethyl group, a 2-methoxyethyl group, a fluorophenyl group, a chlorophenyl group, a bromophenyl group, an iodophenyl group, a methoxyphenyl group, a phenoxyphenyl group, a methoxyphenylvinyl group, a nitrophenyl group, a cyanophenyl group, a carboxyphenyl group and a 9,10-dimethoxyanthracenyl group.

$R^3$ represents a halogen atom, a hydrocarbon group having 10 or less carbon atoms (for example, an alkyl group, an alkenyl group, an aralkyl group or an aryl group), which may have a substituent group, or an alkoxyl group having 10 or less carbon atoms.

Specific examples thereof include halogen atoms such as fluorine, chlorine, bromine and iodine; hydrocarbon groups such as a methyl group, an ethyl group, a n-propyl group, a i-propyl group, an allyl group, a n-butyl group, a sec-butyl group, a t-butyl group, a hexyl group, a cyclohexyl group, a benzyl group, a phenyl group and a tolyl group; substituent group-containing hydrocarbon groups such as a 2-methoxyethyl group, a fluorophenyl group, a chlorophenyl group, a bromophenyl group, an iodophenyl group and a methoxyphenyl group; and alkoxyl groups such as a methoxy group and an ethoxy group.

Further, when n is 2 or more, two adjacent $R^3$'s may be bonded to each other to perform cyclocondensation.

$Ar^1$ and $Ar^2$, which may be the same or different, each represents an aryl group having 20 or less carbon atoms, which may have a substituent group, and preferably represents an aryl group having 6 to 14 carbon atoms.

Specific examples thereof include a phenyl group, a tolyl group, a xylyl group, a cumenyl group, a mesityl group, a dodecylphenyl group, a phenylphenyl group, a naphthyl group, a fluorophenyl group, a chlorophenyl group, a bromophenyl group, an iodophenyl group, a chloronaphthyl group, a methoxyphenyl group, a phenoxyphenyl group, an ethoxynaphthyl group, a nitrophenyl group, a cyanophenyl group, a carboxyphenyl group, a nitronaphthyl group and an anthracenyl group.

$R^6$ represents a bivalent hydrocarbon group having 20 or less carbon atoms (for example, an alkylene group, an alkenylene group, an aralkylene group or an arylene group), which may have a substituent group.

Specifically, they include an ethynylene group, a 1,2-cyclohexenylene group, a 1,2-phenylene group, a 4-chloro-1,2-phenylene group, a 4-nitro-1,2-phenylene group, a 4-methyl-1,2-phenylene group, a 4-methoxy-1,2-phenylene group, a 4-carboxy-1,2-phenylene group and a 1,8-naphthalenylene group.

n represents an integer of 0 to 4. When n is 0 herein, it is indicated that $R^3$ is not contained, that is to say, that $(R^3)_n$ is a hydrogen atom.

Of the compounds represented by general formulas (I) to (V), preferred compounds are enumerated below.

These compounds can be synthesized by methods described in JP-A-2-100054 and JP-A-2-100055.

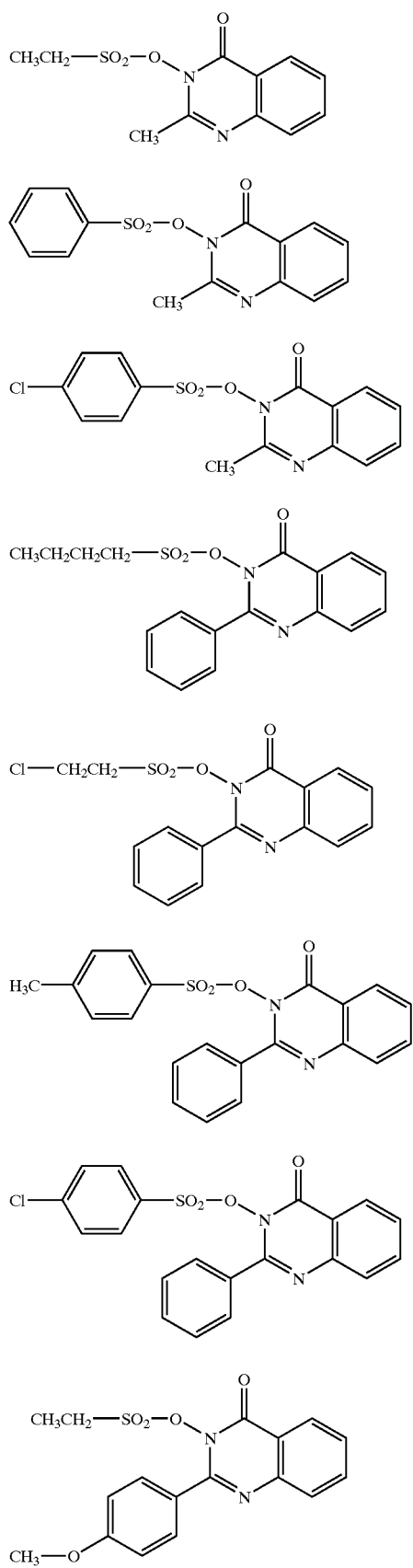
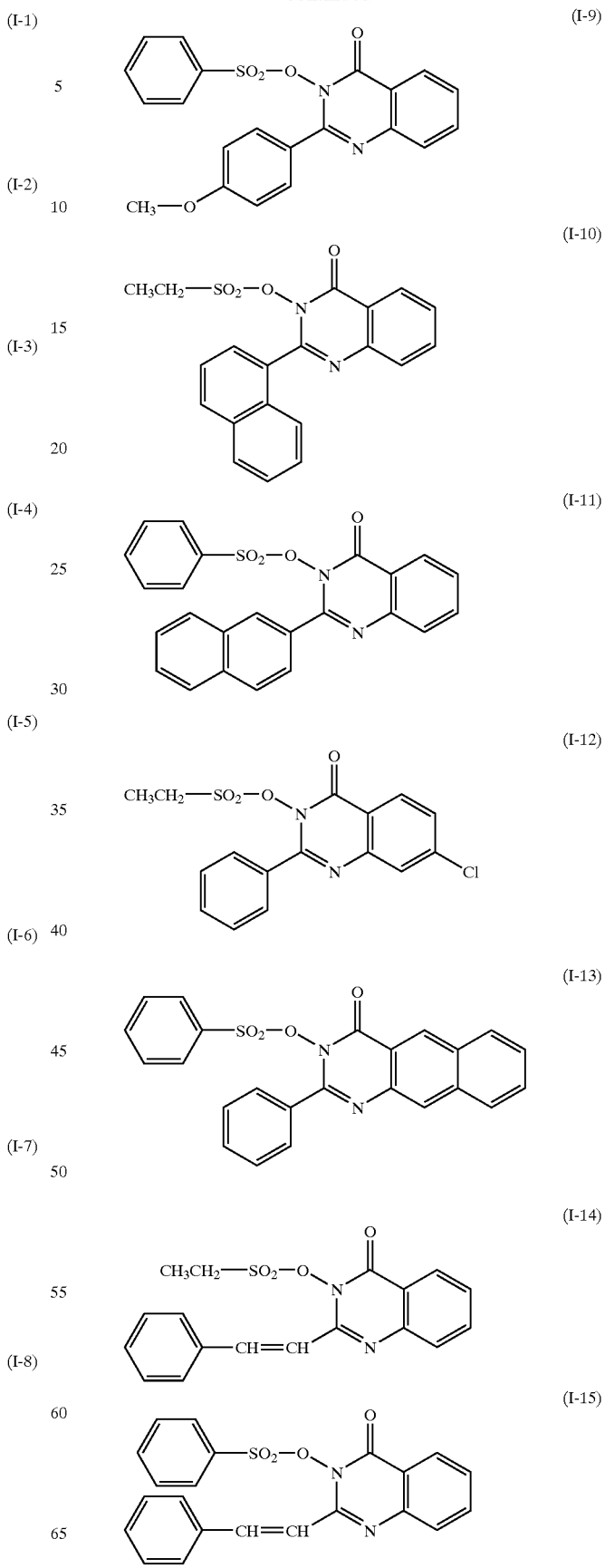

(I-16) 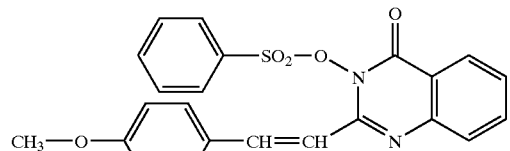
(II-1) 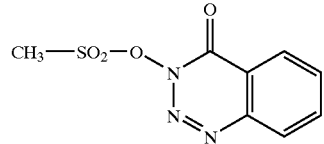
(II-2) 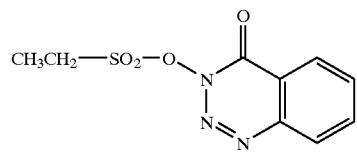
(II-3) 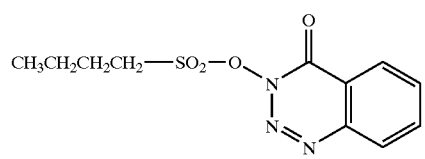
(II-4) 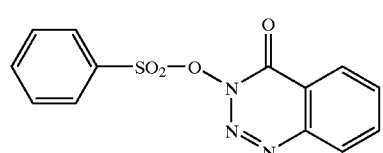
(II-5) 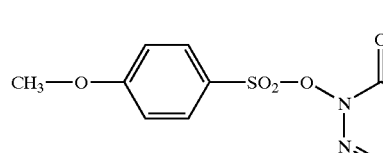
(II-6) 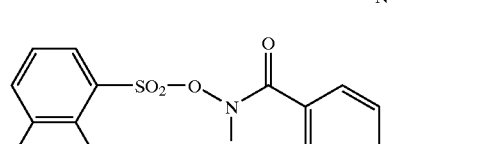
(III-1) 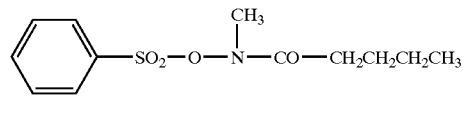
(III-2) 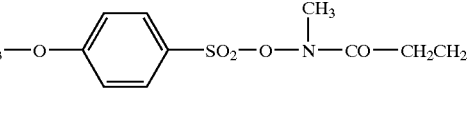
(III-3) 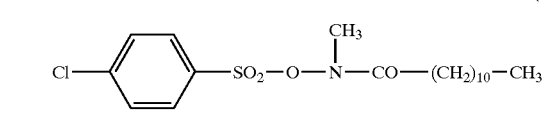
(III-4) 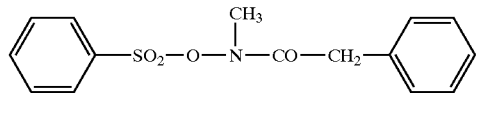
(III-5) 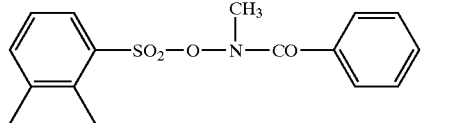
(III-6) 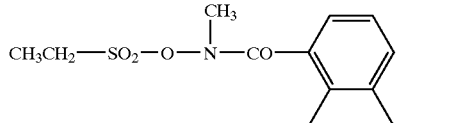
(III-7) 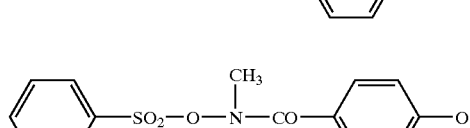
(III-8) 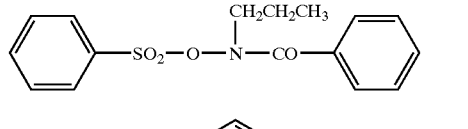
(III-9) 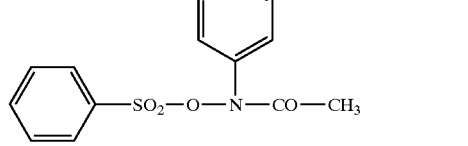
(III-10) 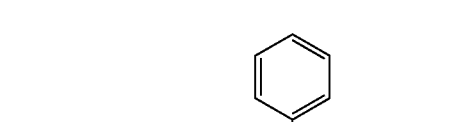
(III-11) 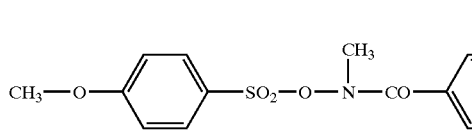
(III-12) 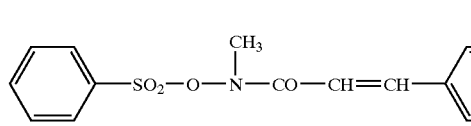
(III-13) 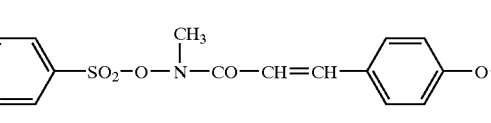
(III-14) 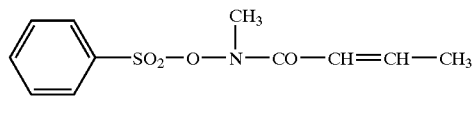

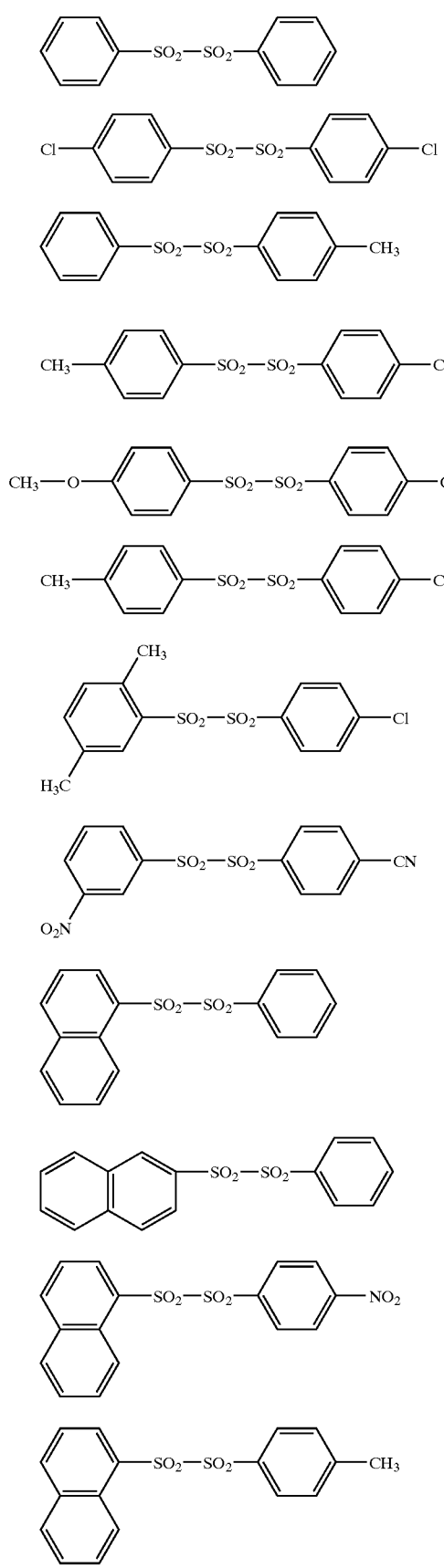
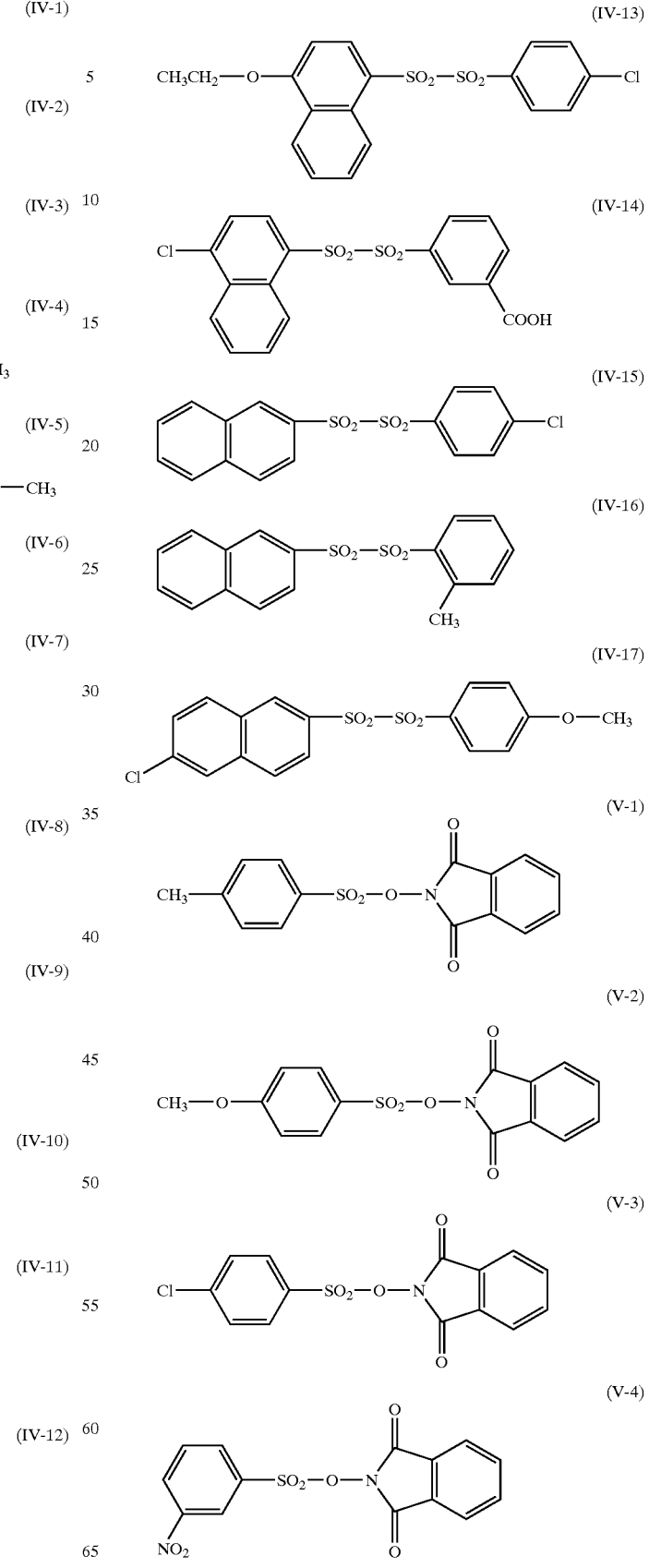

(V-5) 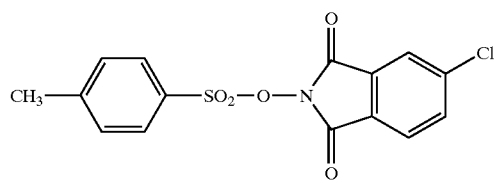

(V-6) 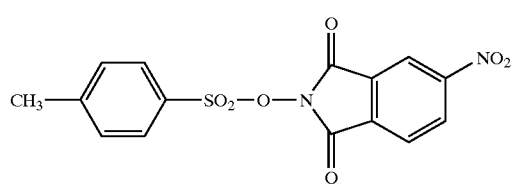

(V-7) 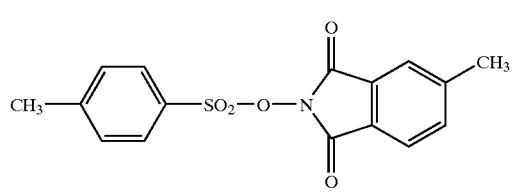

(V-8) 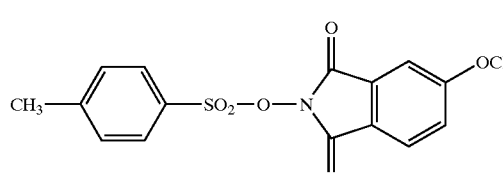

(V-9) 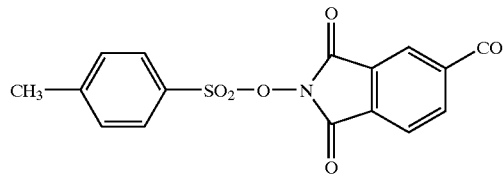

(V-10) 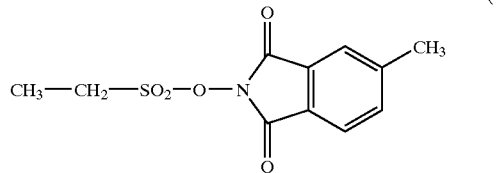

(V-11) 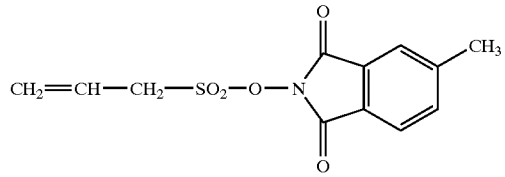

(V-12) 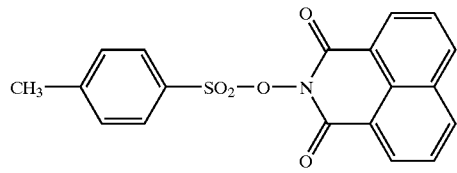

(V-13)

(V-14)

(V-15)

(V-16)

(V-17)

(V-18)

The compounds decomposed by heat to generate acids (component C) suitably include also an onium salt to which a halide or a sulfonic acid is a counter ion, preferably one having any one structure of a iodonium salt represented by the following general formula (VI), a sulfonium salt represented by the following general formula (VII) and a diazonium salt represented by the following general formula (VIII):

$$Ar^3\text{—}I^+\text{—}Ar^4\ X^- \quad (VI)$$

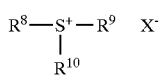

(VII)

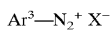

(VIII)

wherein X⁻ is a halide ion, $ClO_4^-$, $PF_6^-$, $SbF_6^-$, $BF_4^-$ or $R^7$—$SO_3^-$, wherein $R^7$ represents a hydrocarbon group having 20 or less carbon atoms, which may have a substituent group, $Ar^3$ and $Ar^4$ each represents an aryl group having 20 or less carbon atoms, which may have a substituent group, and $R^8$, $R^9$ and $R^{10}$ each represents a hydrocarbon group having 18 or less carbon atoms, which may have a substituent group.

In the above-mentioned general formulas, $R^7$—$SO_3^-$ is particularly preferably used as X⁻, wherein $R^7$ represents a hydrocarbon group having 20 or less carbon atoms, which may have a substituent group. Specific examples of the hydrocarbon groups represented by $R^7$ include alkyl groups such as a methyl group, an ethyl group, a n-propyl group, an i-propyl group, a n-butyl group, a sec-butyl group, a t-butyl group, a hexyl group, a cyclohexyl group, an octyl group, a 2-ethylhexyl group and a dodecyl group; alkenyl groups such as an allyl group, a vinyl group, a 1-methylvinyl group and a 2-phenylvinyl group; aralkyl groups such as a benzyl group and a phenethyl group; and aryl groups such as a phenyl group, a tolyl group, a xylyl group, a cumenyl group, a mesityl group, a dodecylphenyl group, a phenylphenyl group, a naphthyl group and an anthracenyl group.

These hydrocarbon groups may each have a substituent group such as a halogen tom, a hydroxyl group, an alkoxyl group, an allyloxy group, a nitro group, a cyano group, a carbonyl group, a carboxyl group, an alkoxycarbonyl group, an anilino group or acetamido group. Specific examples of the substituent group-containing hydrocarbon groups include a trifluoromethyl group, a 2-methoxyethyl group, a 10-camphanyl group, a fluorophenyl group, a chlorophenyl group, a bromophenyl group, an iodophenyl group, a methoxyphenyl group, a hydroxyphenyl group, a phenoxyphenyl group, a nitrophenyl group, a cyanophenyl group, a carboxyphenyl group, a methoxynaphthyl group, a dimethoxyanthracenyl group, a diethoxyanthracenyl group and an anthraquinonyl group.

$Ar^3$ and $Ar^4$ each represents an aryl group having 20 or less carbon atoms, which may have a substituent group. Specific examples thereof include a phenyl group, a tolyl group, a xylyl group, a cumenyl group, a mesityl group, a dodecylphenyl group, a phenylphenyl group, a naphthyl group, an anthracenyl group, a fluorophenyl group, a chlorophenyl group, a bromophenyl group, an iodophenyl group, a methoxyphenyl group, a hydroxyphenyl group, a phenoxyphenyl group, a nitrophenyl group, a cyanophenyl group, a carboxyphenyl group, an anilinophenyl group, an anilinocarbonylphenyl group, a morphorinophenyl group, a phenylazophenyl group, a methoxynaphthyl group, a hydroxynaphthyl group, a nitronaphthyl group and an anthraquinonyl group.

$R^8$, $R^9$ and $R^{10}$ each independently represents a hydrocarbon group having 18 or less carbon atoms, which may have a substituent group. Specific examples thereof include hydrocarbon groups such as a methyl group, an ethyl group, a n-propyl group, an i-propyl group, an allyl group, a n-butyl group, a sec-butyl group, a t-butyl group, a hexyl group, a cyclohexyl group, a benzyl group, a phenyl group, a tolyl group, a t-butylphenyl group, a naphthyl group and an anthracenyl group; and substituent group-containing hydrocarbon groups such as a 2-methoxyethyl group, a fluorophenyl group, a chlorophenyl group, a bromophenyl group, an iodophenyl group, a methoxyphenyl group, a hydroxyphenyl group, a phenylthiophenyl group, a hydroxynaphthyl group, a methoxynaphthyl group, a benzoylmethyl group and a naphthoylmethyl group.

Further, $R^8$ and $R^9$ may combine with each other to form a ring.

Cation moieties of the onium salts represented by general formulas (VI) to (VIII) include an iodonium ion, a sulfonium ion and a diazonium ion. As for the cation moieties of these onium salts, specific structures include but are not limited to the following:

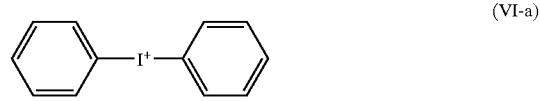

(VI-a)

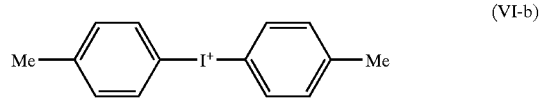

(VI-b)

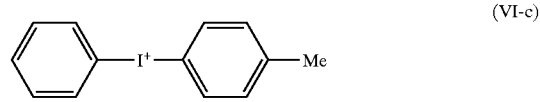

(VI-c)

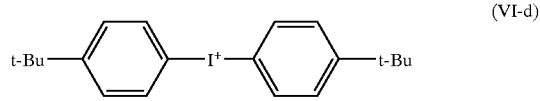

(VI-d)

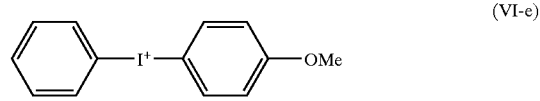

(VI-e)

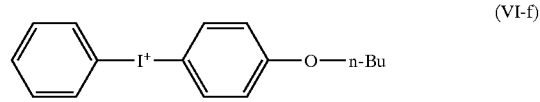

(VI-f)

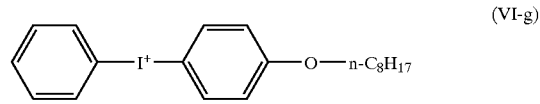

(VI-g)

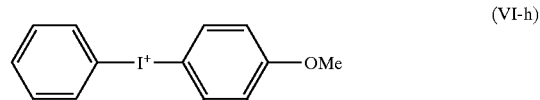

(VI-h)

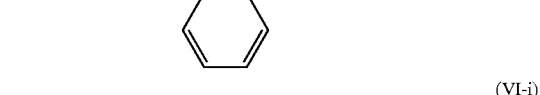

(VI-i)

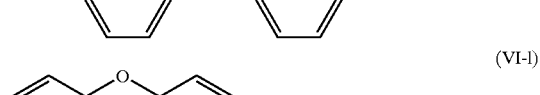

(VI-l)

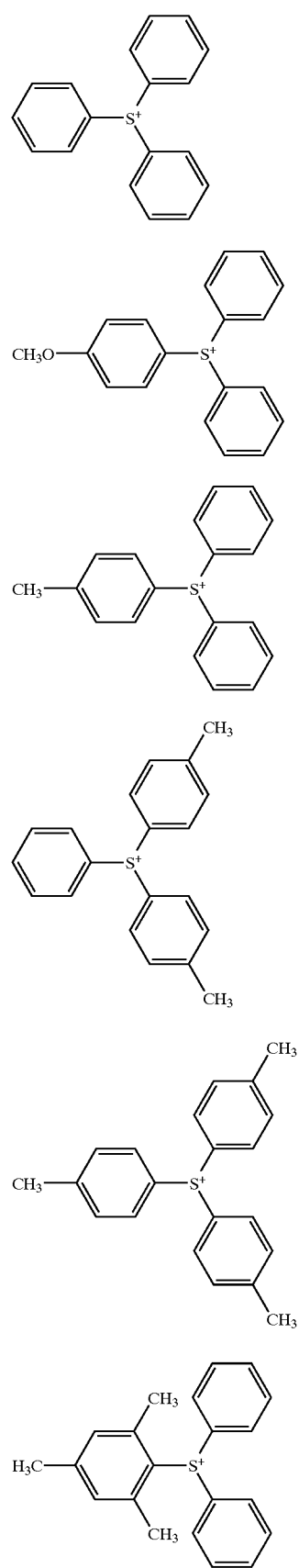
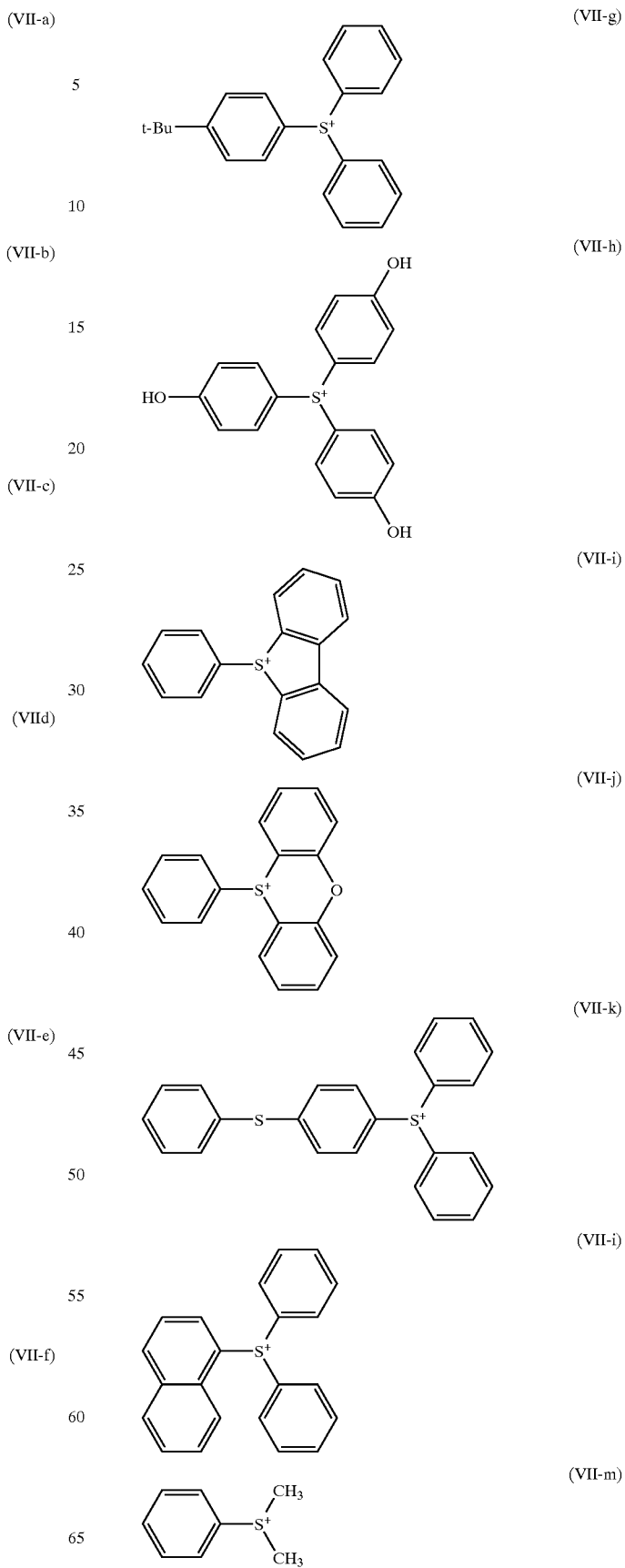

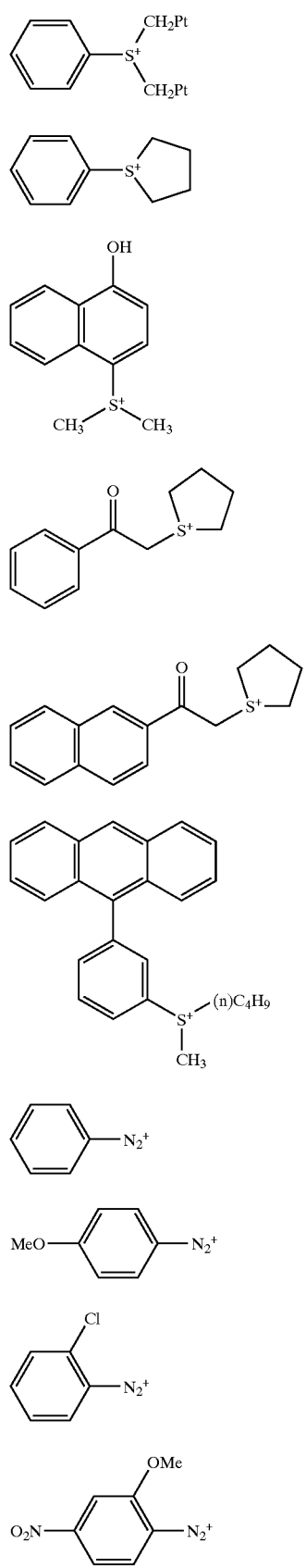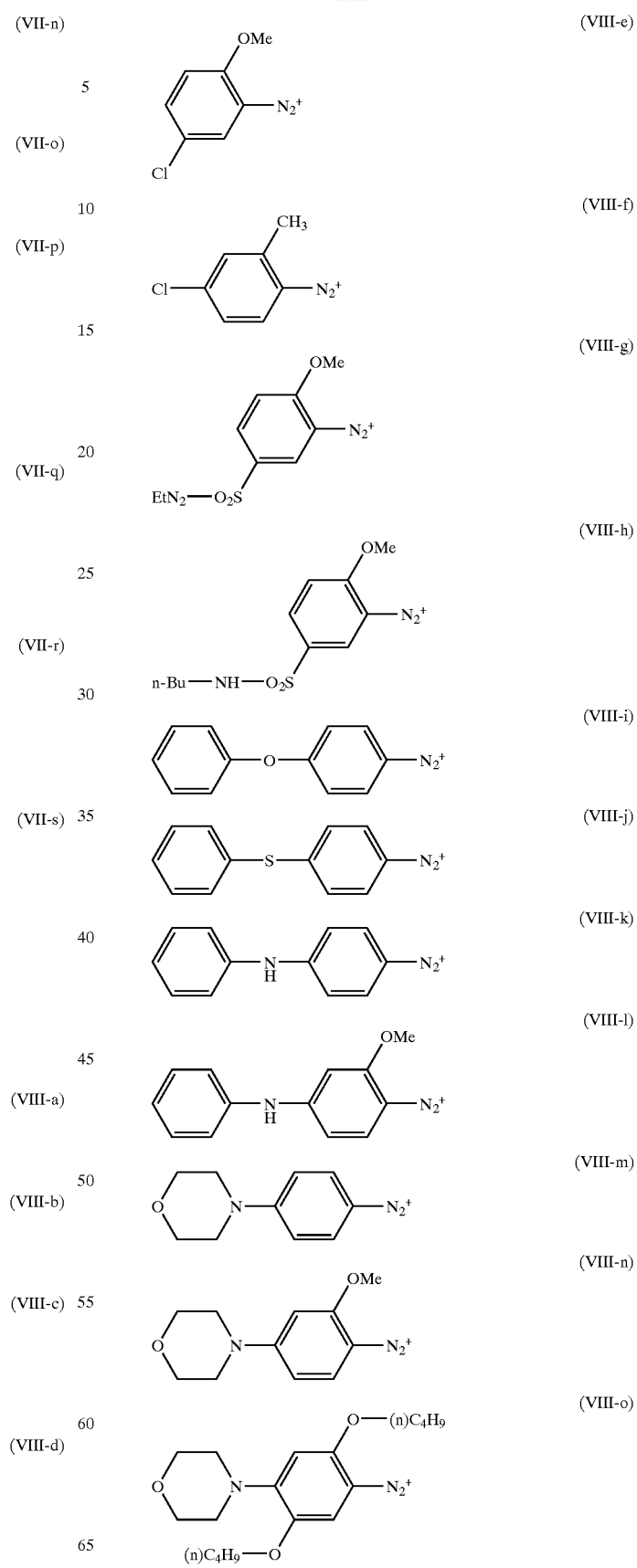

(VIII-p) 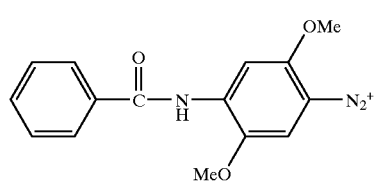
(VIII-q) 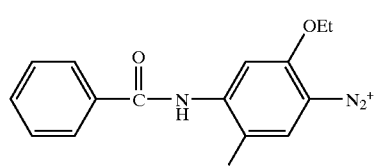
(VIII-r) 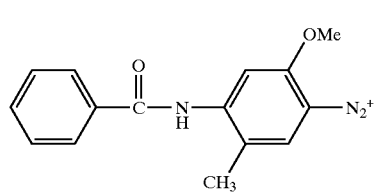
(VIII-s) 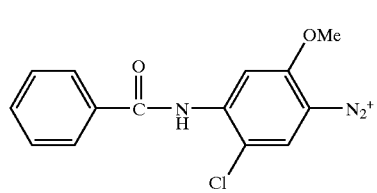
(VIII-t) 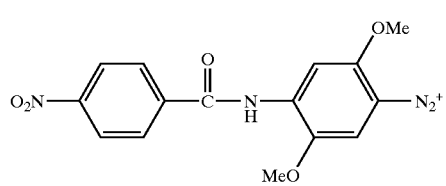
(VIII-u) 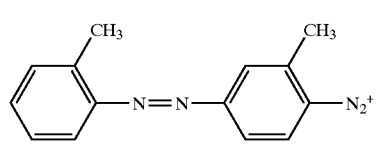
(VIII-v) 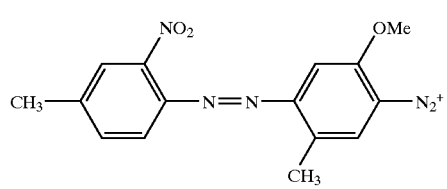
(VIII-w) 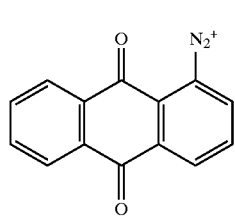
Further, specific structures of the cation moieties of the other diazonium salts include the following:
(I-a) 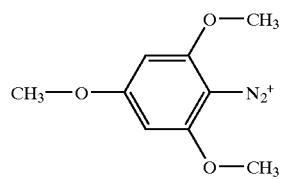
(I-b) 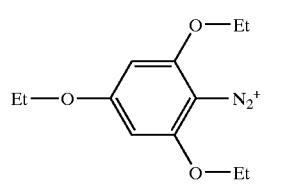
(I-c) 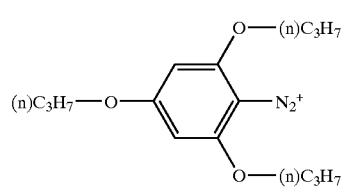
(I-d) 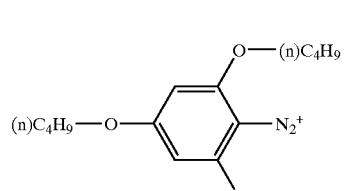
(I-e) 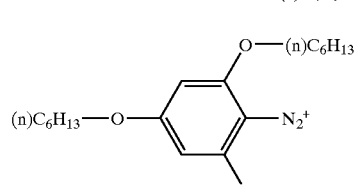
(I-f) 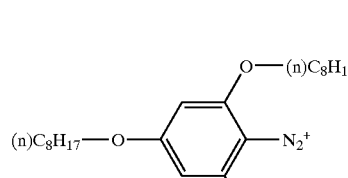
(I-g) 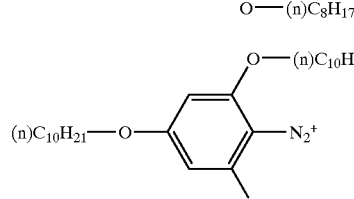
(I-h) 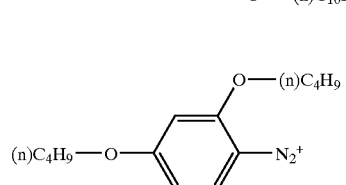

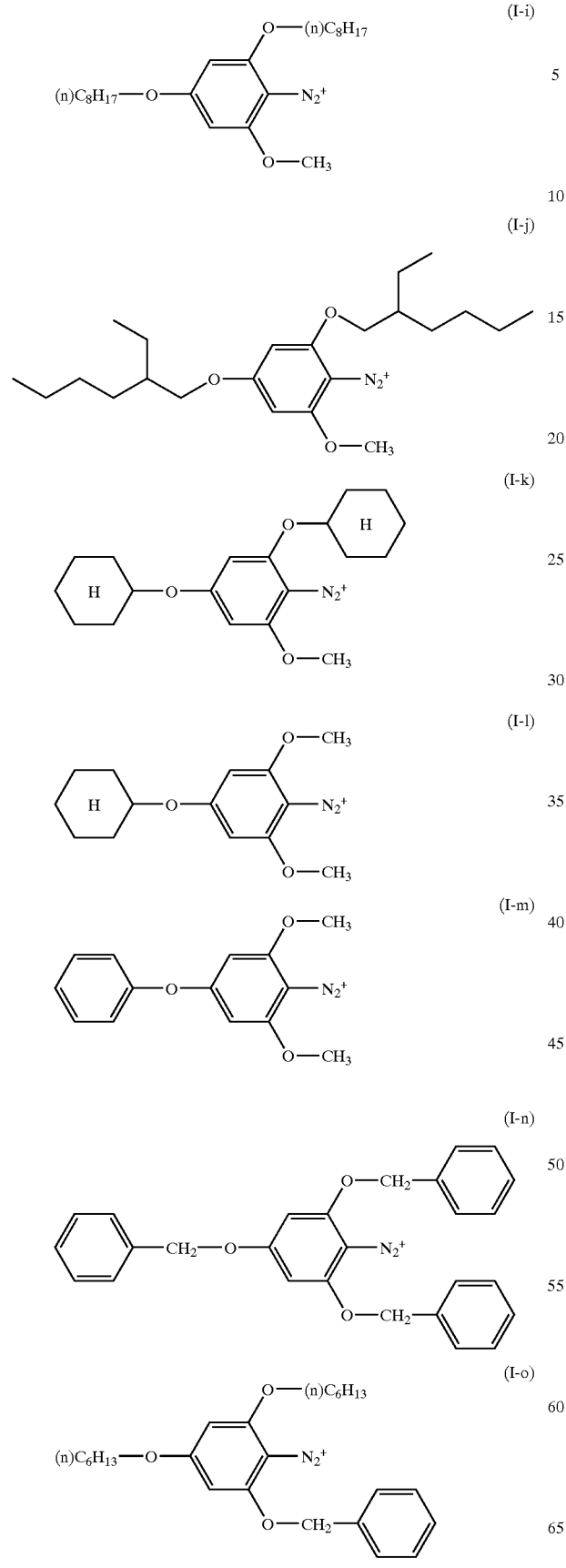
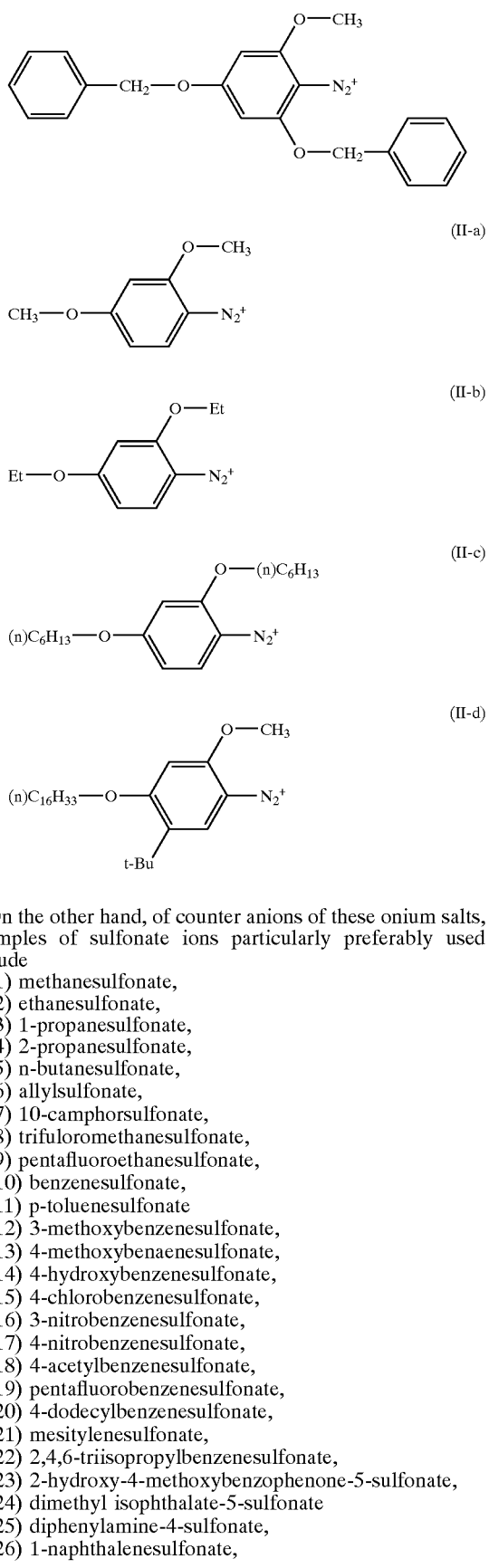

On the other hand, of counter anions of these onium salts, examples of sulfonate ions particularly preferably used include
(1) methanesulfonate,
(2) ethanesulfonate,
(3) 1-propanesulfonate,
(4) 2-propanesulfonate,
(5) n-butanesulfonate,
(6) allylsulfonate,
(7) 10-camphorsulfonate,
(8) trifuloromethanesulfonate,
(9) pentafluoroethanesulfonate,
(10) benzenesulfonate,
(11) p-toluenesulfonate
(12) 3-methoxybenzenesulfonate,
(13) 4-methoxybenaenesulfonate,
(14) 4-hydroxybenzenesulfonate,
(15) 4-chlorobenzenesulfonate,
(16) 3-nitrobenzenesulfonate,
(17) 4-nitrobenzenesulfonate,
(18) 4-acetylbenzenesulfonate,
(19) pentafluorobenzenesulfonate,
(20) 4-dodecylbenzenesulfonate,
(21) mesitylenesulfonate,
(22) 2,4,6-triisopropylbenzenesulfonate,
(23) 2-hydroxy-4-methoxybenzophenone-5-sulfonate,
(24) dimethyl isophthalate-5-sulfonate
(25) diphenylamine-4-sulfonate,
(26) 1-naphthalenesulfonate,

(27) 2-naphthalenesulfonate,
(28) 2-naphthol-6-sulfonate,
(29) 2-naphthol-7-sulfonate,
(30) anthraquinone-1-sulfonate,
(31) anthraquinone-2-sulfonate,
(32) 9,10-dimethoxyanthracene-2-sulfonate,
(33) 9,10-diethoxyanthracene-2-sulfonate,
(34) quinoline-8-sulfonate,
(35) 8-hydroxyquinoline-5-sulfonate, and
(36) 8-anilino-naphthalene-1-sulfonate.

Further, salts of disulfonates as shown below and two equivalents of the onium salt cations can also be used:
(41) m-benzenedisulfonate,
(42) benzaldehyde-2,4-disulfonate,
(43) 1,5-naphthalenedisulfonate,
(44) 2,6-naphthalenedisulfonate,
(45) 2,7-naphthalenedisulfonate,
(46) anthraquinone-1,5-disulfonate,
(47) anthraquinone-1,8-disulfonate,
(48) anthraquinone-2,6-disulfonate,
(49) 9,10-dimethoxyanthracene-2,6-disulfonate, and
(50) 9,10-diethoxyanthracene-2,6-disulfonate.

The onium salt sulfonate satisfactorily used in the invention can be obtained by mixing a corresponding Cl⁻ salt or the like with a sulfonic acid or with a sodium or potassium sulfonate in water or a mixed solvent of water and a hydrophilic solvent such as an alcohol to conduct salt exchange.

The onium compounds can be synthesized by known methods, for example, methods described in *Maruzen-Shin Jikken Kagaku Koza,* vol. 14-I, chapter 2•3 (p. 448), vol. 14-III, chapter 8•16 (p. 1838) and chapter 7•14 (p. 1564), J. W. Knapczyk et al., *J. Am. Chem. Soc.,* 91, 145 (1969), A. L. Maycok et al., J. Org. Chem., 351, 2532 (1970), J. V. Crivello et al., *Polym. Chem. Ed.,* 18, 2677 (1980), U.S. Pat. Nos. 2,807,648 and 4,247,473, JP-A-53-101331 and JP-B-5-53166.

Preferred examples of the onium salt sulfonates satisfactorily used as the acid generating agents in the invention are enumerated below:

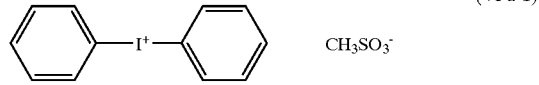
(VI-a-1)

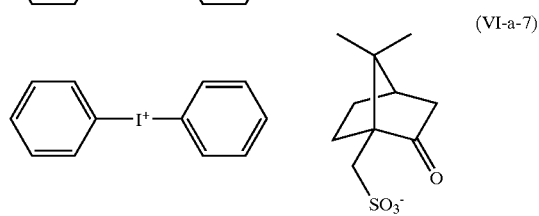
(VI-a-7)

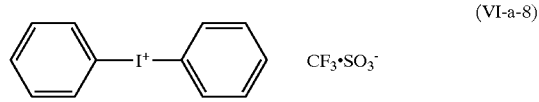
(VI-a-8)

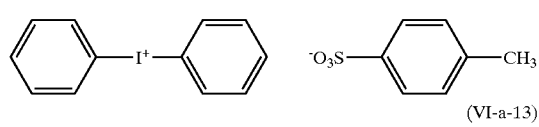
(VI-a-11)

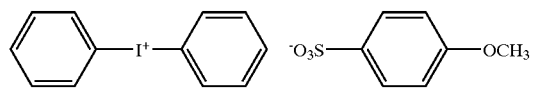
(VI-a-13)

-continued

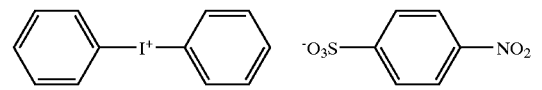
(VI-a-17)
(VI-a-20)

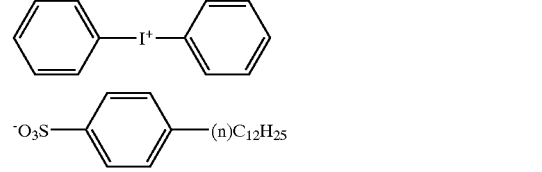
(VI-a-27)

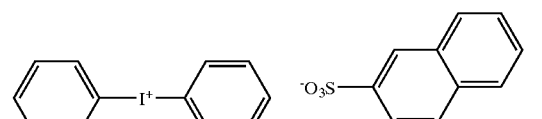
(VI-a-31)

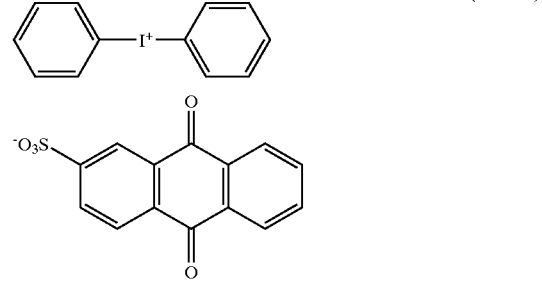
(VI-a-32)

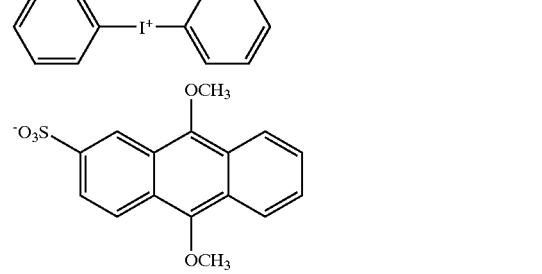
(VI-a-33)

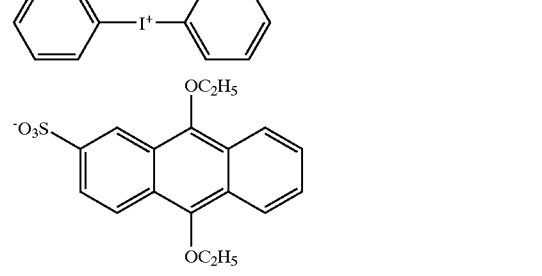
(VI-a-36)

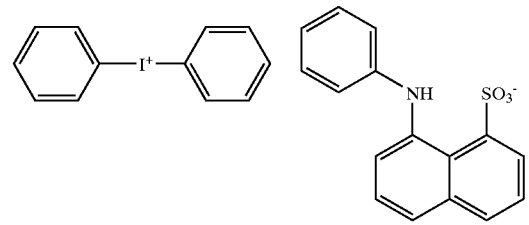

-continued
(VI-a-50)
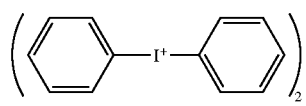
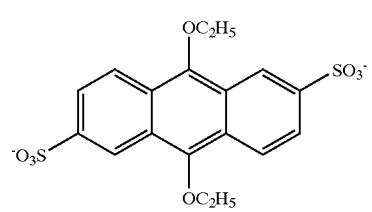
(VI-d-8)
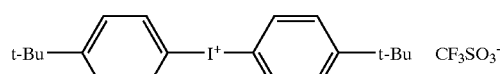
(VI-e-8)
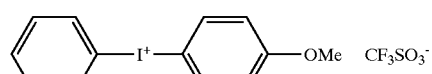
(VI-g-8)
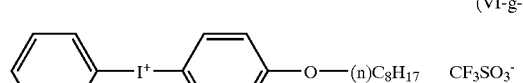
(VI-g-11)
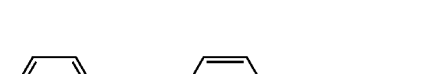
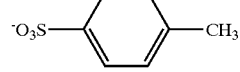
(VI-i-11)
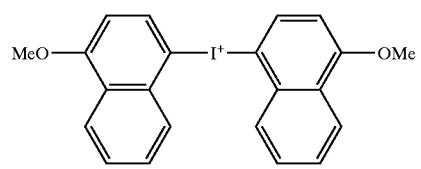
(VI-j-11)
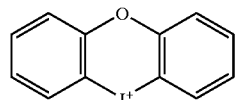
(VII-a-1)
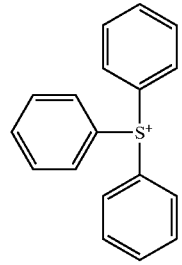 CH₃SO₃⁻
-continued
(VII-a-2)
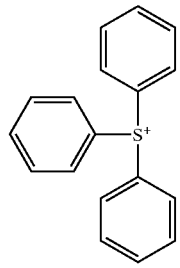 C₂H₅SO₃⁻
(VII-a-5)
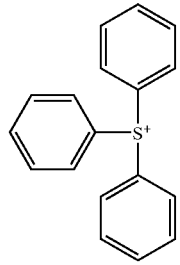 (n)C₄H₉—SO₃⁻
(VII-a-7)
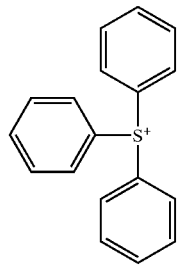 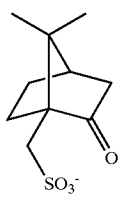
(VII-a-8)
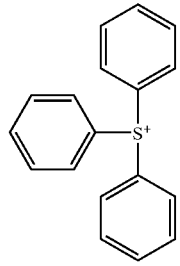 CF₃SO₃⁻
(VII-a-10)
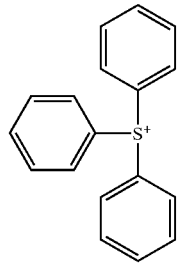 ⁻O₃S—⟨Ph⟩
(VII-a-11)
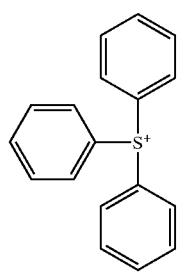 ⁻O₃S—⟨Ph⟩—CH₃

(VII-a-13)
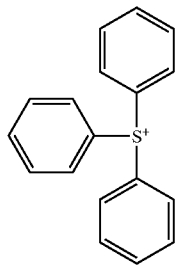 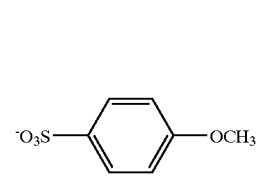
(VII-a-15)
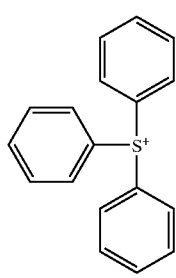 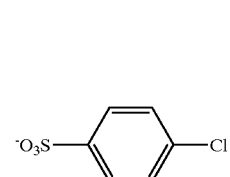
(VII-a-17)
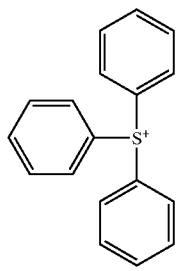 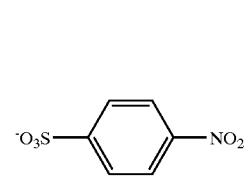
(VII-a-20)
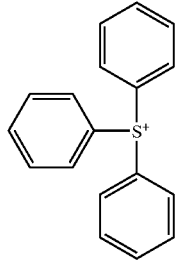 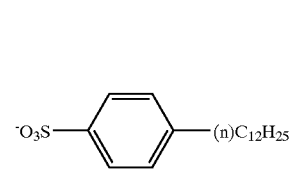
(VII-a-21)
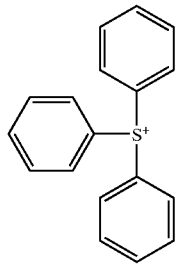 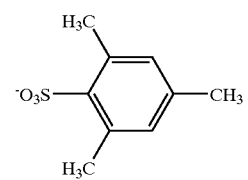
(VII-a-22)
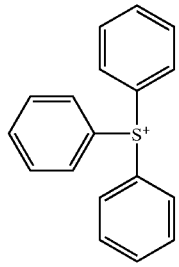 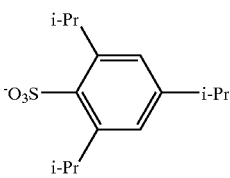
(VII-a-23)
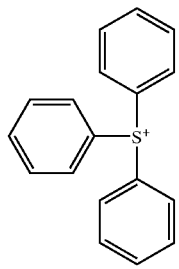
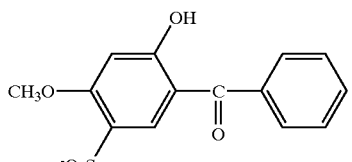
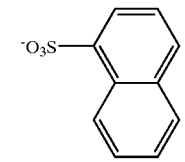
(VII-a-26)
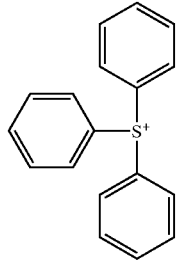 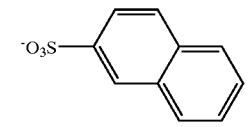
(VII-a-27)
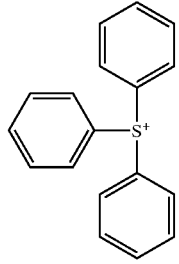
(VII-a-31)
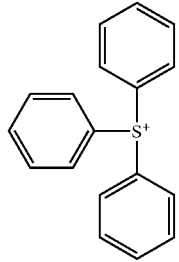 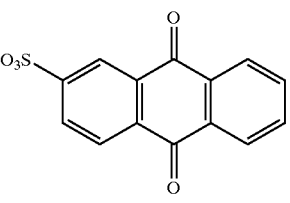

(VII-a-32)
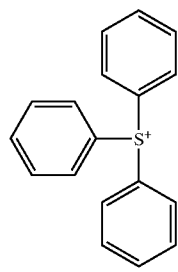 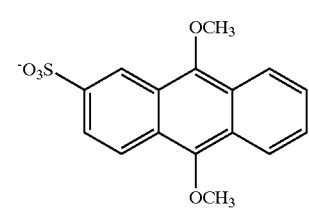
(VII-a-33)
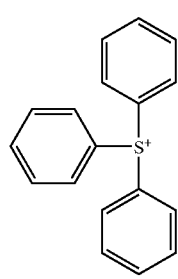 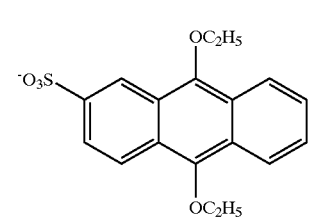
(VII-b-8)
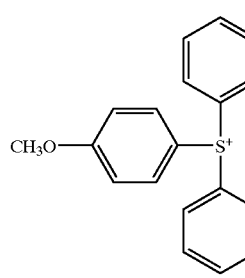
(VII-c-8)
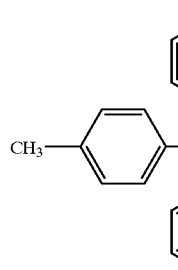
(VII-d-8)
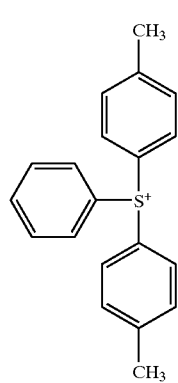
(VII-e-8)
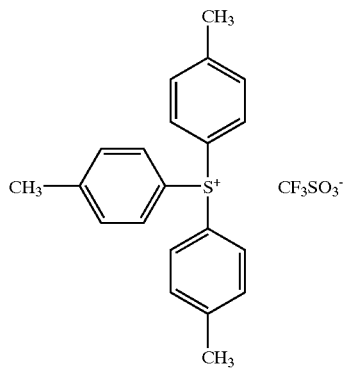
(VII-f-8)
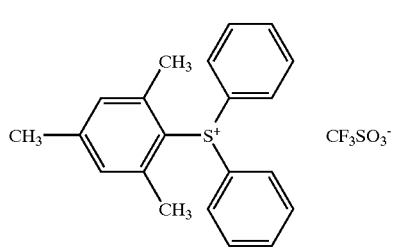
(VII-g-8)
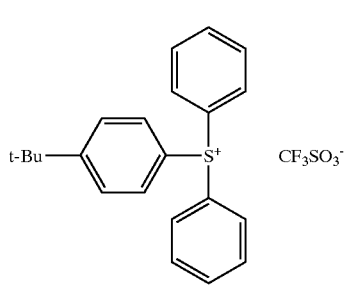
(VII-h-8)
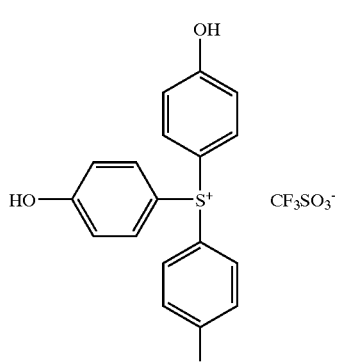
(VII-j-11)
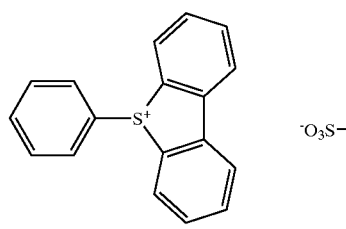

-continued
(VII-k-8)
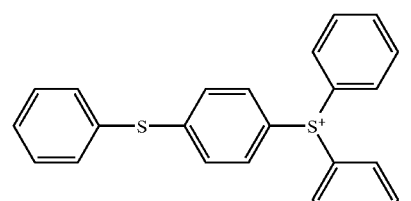
(VII-k-13)
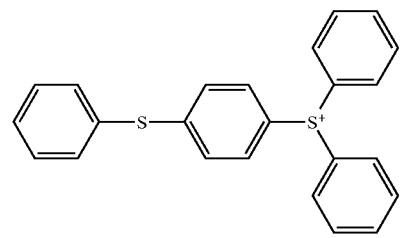
(VII-o-11)
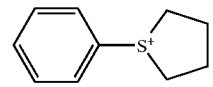 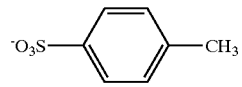
(VII-p-8)
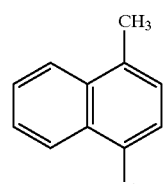
(VII-r-8)
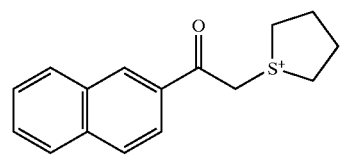
(VIII-b-20)
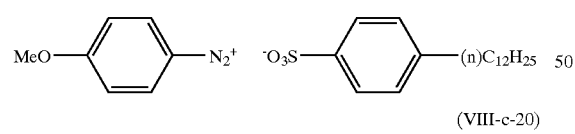
(VIII-c-20)
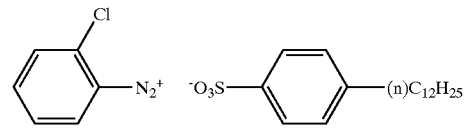
(VIII-d-21)
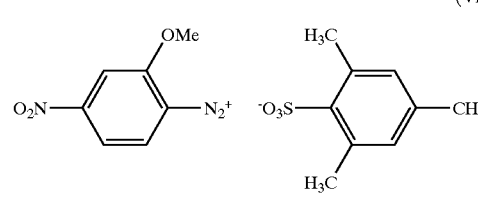
-continued
(VIII-e-21)
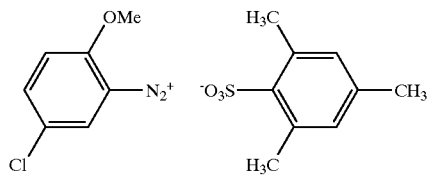
(VIII-k-20)
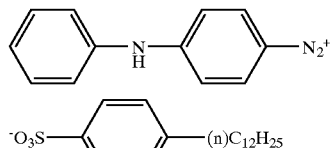
(VIII-k-21)
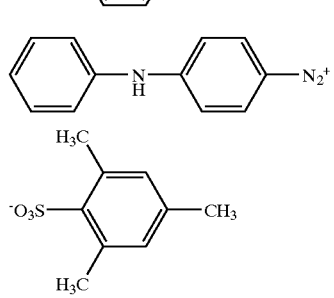
(VIII-l-21)
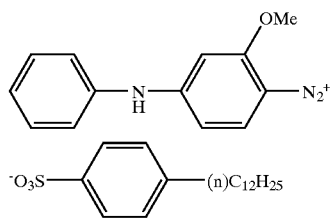
(VIII-o-8)
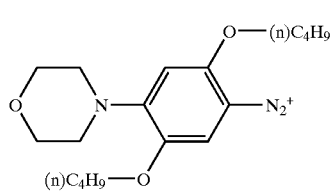
(VIII-p-21)
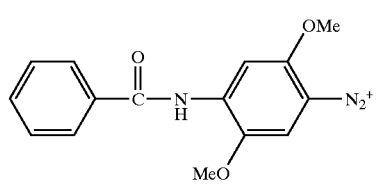
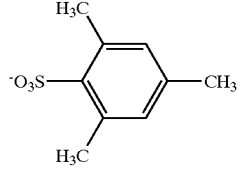
(VIII-t-20)
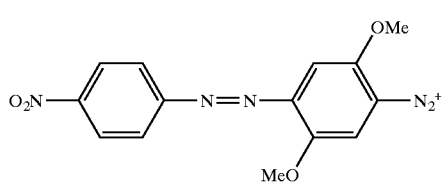

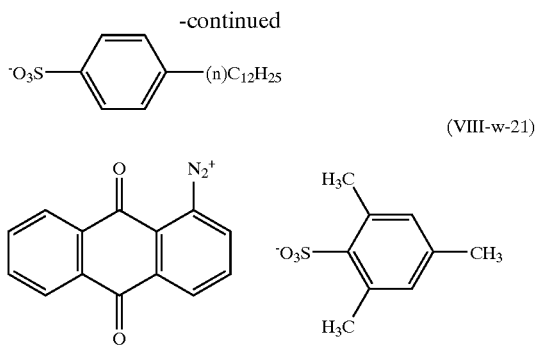

These acid generating agents are each added to the composition in an amount of 0.01% to 50% by weight, preferably in an amount of 0.1% to 25% by weight, and more preferably in an amount of 0.5% to 20% by weight, based on the total solid content of the intermediate layer material composition.

These compounds may be used either alone or as a combination of two or more of them.

(4) Solvents Used in the Invention (Component D)

The organic solvents available in the invention include, for example, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, xylene, chlorobenzene, hexane, ethyl acetate, propyl acetate, butyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone and tetrahydrofuran.

These solvents are used either alone or as a combination of them. The selection of the solvent is important, because it influences solubility, coating properties on a substrate and storage stability to the positive-working photoresist composition of the invention. It is preferred that water contained in the solvent is smaller in an amount, because it influences various resist properties.

Of these solvents, cyclohexanone, 2-heptanone, propylene glycol monomethyl ether acetate, methyl methoxypropionate and butyl acetate are particularly preferred from the viewpoints of solubility and coating properties.

(5) Surfactants (Component E)

The composition of the invention preferably contains any one of fluorine and/or silicon surfactants (a fluorine surfactant, a silicone surfactant and a surfactant containing both of a fluorine atom and a silicon atom), or two or more of them.

The composition of the invention containing the above-mentioned surfactant decreases a variation in coating film thickness on a wafer surface and forms no voids to provide a uniform coating film.

These surfactants include, for example, surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451, and the following commercially available surfactants can also be used as such.

The commercially available surfactants which can be used include, for example, fluorine surfactants or silicone surfactants such as Eftop EF301 and EF303 (manufactured by Shin Akita Kasei Co., Ltd.), Fluorad FC430 and FC431 (manufactured by Sumitomo 3M Ltd.), Megafac F171, F173, F176, F189 and R08 (manufactured by Dainippon Ink & Chemicals Inc.), Surflon S-382, SC101, SC102, SC103, SC104, SC105 and SC106 (manufactured by Asahi Glass Co., Ltd.) and Troy Sol S-366 (manufactured by Troy Chemical Co., Ltd.). Further, Polysiloxane Polymer KP-341 (manufactured by Shin-Etsu Chemical Co., Ltd.) can also be used as the silicone surfactant.

Further, as the surfactants, there can be used surfactants using polymers having fluoroaliphatic groups derived from fluoroaliphatic compounds produced by telomerization (also called a telomer process) or oligomerization (also called a oligomer process), as well as known surfactants as descried above. The fluoroaliphatic compounds can be synthesized by methods described in JP-A-2002-90991.

As the fluoroaliphatic group-containing polymer, preferred is a copolymer of a fluoroaliphatic group-containing monomer and a (poly(oxyalkylene)) acrylate and/or a (poly(oxyalkylene)) methacrylate, which may be either a random copolymer or a block copolymer. The poly(oxyalkylene) groups include a poly(oxyethylene) group, a poly(oxypropylene) group and a poly(oxybutylene) group. Further, there may be used a unit having alkylene chains different in length in the same chain length, such as a block copolymer group of oxyethylene, oxypropylene and oxyethylene, or a block copolymer group of oxyethylene and oxypropylene. Furthermore, the copolymer of the fluoroaliphatic group-containing monomer and the (poly(oxyalkylene)) acrylate (or methacrylate) may be not only a two component copolymer but also a three or more component copolymer in which two or more types of different fluoroaliphatic group-containing monomers and/or two or more types of different (poly(oxyalkylene)) acrylates (or methacrylates) are co-polymerized at the same time.

For example, commercially available surfactants include Megafac F178, F470, F473, F475, F476 and F472 (manufactured by Dainippon Ink & Chemicals Inc.). Further, such surfactants include a copolymer of a $C_6F_{13}$ group-containing acrylate (or methacrylate) and a (poly(oxyalkylene)) acrylate (or methacrylate), a copolymer of a $C_6F_{13}$ group-containing acrylate (or methacrylate), (poly(oxyethylene)) acrylate (or methacrylate) and (poly(oxypropylene)) acrylate (or methacrylate), a copolymer of a $C_8F_{17}$ group-containing acrylate (or methacrylate) and a (poly(oxyalkylene)) acrylate (or methacrylate), and a copolymer of a $C_8F_{17}$ group-containing acrylate (or methacrylate), (poly(oxyethylene)) acrylate (or methacrylate) and (poly(oxypropylene)) acrylate (or methacrylate).

The amount of the surfactant used is preferably from 0.0001% to 2% by weight, and more preferably from 0.001% to 1% by weight, based on the total amount of the intermediate layer material composition (excluding the solvent).

In the invention, surfactants other than the above-mentioned fluorine and/or silicone surfactants can also be added. Specific examples of such surfactants include non-ionic surfactants such as polyoxyethylene alkyl ethers such as polyoxyethylene lauryl ether, polyoxyethylene stearyl ether, polyoxyethylene cetyl ether and polyoxyethylene oleyl ether; polyoxyethylene alkyl allyl ethers such as polyoxyethylene octyl phenol ether and polyoxyethylene nonyl phenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

These surfactants may be added either alone or as a combination of some of them.

Further, in the composition of the invention, it is preferred that metal impurities such as metal, and impurity ingredients such as a chlorine ion are reduced to 100 ppb or less. The presence of these impurities in large amounts unfavorably results in poor operation, defects and decreased yields in fabricating semiconductor devices.

The solid content of the composition is preferably from 1% to 40% by weight, more preferably from 2% to 30% by weight, and still more preferably from 3% to 20% by weight, as the concentration of solid matter dissolved in the solvent.

In order to remove foreign matter, it is preferred that a solution prepared by dissolving the composition in the solvent is usually filtered through a filter having, for example, a pore size of about 0.05 to about 0.2 $\mu$m prior to use.

The composition of the invention can further contain a dye and a spectral sensitizer as needed.

A plasticizer can also be used in the composition of the invention. Examples of such plasticizers include compounds described in JP-A-4-212960, JP-A-8-262720, European Patents 735,422, 416,873 and 439,371, and U.S. Pat. No. 5,846,690, specifically, di(2-ethylhexyl) adipate, n-hexyl benzoate, di-n-octyl phthalate, di-n-butyl phthalate, benzyl-n-butyl phthalate and dihydroabietyl phthalate.

The suitable dyes usable in the invention are oil dyes and basic dyes. Specific examples of such dyes include Oil Yellow #101, Oil Yellow #103, Oil Pink #312, Oil Green BG, Oil Blue BOS, Oil Blue #603, Oil Black BY, Oil Black BS, Oil Black T-505 (the above dyes are manufactured by Orient Kagaku Kogyo Co., Ltd.), Crystal Violet (CI42555), Methyl Violet (CI42535), Rhodamine B (CI45170B), Malachite Green (CI42000) and Methylene Blue (CI52015).

Further, spectral sensitizers as shown below can be added. Preferred examples of the spectral sensitizers include but are not limited to benzophenone, p,p'-tetramethyldiaminobenzophenone, p,p'-tetraethylethylaminobenzophenone, 2-chloro-thioxanthone, anthrone, 9-ethoxyanthracene, anthracene, pyrene, perylene, phenothiazine, benzyl, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethyl-anthraquinone, 2-tert-butylanthraquinone, 1,2-benzanthraquinone, 3-methyl-1,3-diaza-1,9-benzanthrone, di-benzalacetone, 1,2-naphthoquinone, 3,3'-carbonyl-bis(5,7-dimethoxycarbonylcoumarin) and coronene.

These spectral sensitizers can also be used as light absorbers to absorb far ultraviolet light of a light source. In this case, the light absorbers can reduce standing waves by reducing reflected light from the substrates to decrease the influence of multiple reflection in the resist films.

Although appropriate organic polymer films are used as the above-mentioned lower layer resists, various known photoresists may be used. For example, the FH series or FHi series manufactured by FUJIFILM Arch Co. Ltd. or the PFI series manufactured by Sumitomo Chemical Co. Ltd. can be exemplified.

In the laminate of the invention, a lower resist layer is formed on the substrate. This layer is formed by dissolving the compounds contained in the lower resist layer in an appropriate solvent, and applying the resulting solution by spin coating or spraying. The thickness of the lower resist layer is preferably from 0.1 to 4.0 $\mu$m, more preferably from 0.2 to 2.0 $\mu$m, and particularly preferably from 0.25 to 1.5 $\mu$m. The lower resist layer having a thickness of thinner than 0.1 $\mu$m is unfavorable from the viewpoints of antireflection and etching resistance. On the other hand, thicker than 4.0 $\mu$m unfavorably causes the problem that the aspect ratio becomes too high, so that a micro pattern formed is liable to fall down.

Then, the intermediate layer is formed. However, it is preferred that the lower resist layer is heat treated before that. The temperature of the heat treatment is preferably from 150 to 250° C., more preferably from 170 to 240° C., and particularly preferably 180 to 230° C. When the temperature is lower than 150° C., intermixing with the lower resist layer is liable to occur in forming the intermediate layer. On the other hand, exceeding 250° C. results in easy decomposition and deterioration of the polymer contained in the lower-layer resist. Both are therefore unfavorable. This heat treatment can be conducted using a device such as a hot plate or a heat oven.

The time of the heat treatment varies depending on the above-mentioned heat treatment temperature. However, when the heat treatment is conducted at a temperature of 180 to 230° C., the time is established preferably within the range of 10 to 1,000 seconds, and more preferably within the range of 20 to 600 seconds. Shorter than 10 seconds results in insufficient heat hardening and easy intermixing with the intermediate layer, whereas longer than 1,000 seconds results in the decreased number of treated substrates. Both are therefore unfavorable.

Then, the intermediate layer is formed on the lower resist layer. It can be formed in the same manner as with the above-mentioned formation of the lower resist layer. The thickness of the intermediate layer is preferably from 0.02 to 0.6 $\mu$m, more preferably from 0.03 to 0.5 $\mu$m, and particularly preferably from 0.04 to 0.40 $\mu$m. Thinner than 0.02 $\mu$m results in poor pattern transferring properties to the lower resist layer or development of pin holes in the coating film, whereas thicker than 0.6 $\mu$m results in an increased dimensional shift by etching. Both are therefore unfavorable.

Then, an upper resist layer is formed. However, it is preferred that the intermediate layer is heat treated before that. The temperature of the heat treatment is preferably from 150 to 250° C., more preferably from 170 to 250° C., and particularly preferably from 180 to 240° C. When the temperature is lower than 150° C., intermixing with the intermediate layer is liable to occur in forming the upper resist layer. On the other hand, exceeding 250° C. results in easy decomposition and deterioration of the polymer contained in the lower-layer resist. Both are therefore unfavorable. This heat treatment can be conducted using a device such as a hot plate or a heat oven.

The time of the heat treatment varies depending on the above-mentioned heat treatment temperature. However, when the heat treatment is conducted at a temperature of 180 to 230° C., the time is established preferably within the range of 10 to 1,000 seconds, and more preferably within the range of 20 to 600 seconds. Shorter than 10 seconds results in insufficient heat hardening and easy intermixing with the intermediate layer, whereas longer than 1,000 seconds results in the decreased number of treated substrates. Both are therefore unfavorable.

Then, the upper resist layer is formed on the intermediate layer. It can be formed in the same manner as with the above-mentioned formation of the lower resist layer. The thickness of the upper resist layer is preferably from 0.03 to 0.6 μm, more preferably from 0.04 to 0.5 μm, and particularly preferably from 0.05 to 0.45 μm. Thinner than 0.03 μm results in poor pattern transferring properties to the intermediate layer or development of pin holes in the coating film, whereas thicker than 0.6 μm results in poor lithography performance. Both are therefore unfavorable. As the upper resist layer used herein, it is possible to use a positive-working or negative-working resist suitable for each of the light sources of a near-ultraviolet light, KrF, ArF, $F_2$, EUV, EB and an X-ray.

The resulting three-layer resist is then subjected to a pattern formation process. As the first step thereof, the pattern formation treatment is first conducted to the upper-layer resist composition film. Mask alignment is carried out as needed, and high-energy rays are irradiated through the mask, thereby making an irradiated portion of the resist composition soluble or insoluble in an aqueous alkali solution, followed by development with the aqueous alkali solution to form a pattern.

Then, as the second step, dry etching is conducted. This operation is carried out by $CHF_3$ gas plasma etching using the pattern of the above-mentioned upper-layer resist composition film as a mask, thereby forming a micro pattern. The etching of the intermediate layer by this $CHF_3$ gas plasma etching is the same technique as plasma etching utilized in the conventional etching processing of a substrate such as an oxide film. This operation can be carried out with a cylindrical plasma etching apparatus by using a reactive gas, that is to say, a $CHF_3$ gas or a $CF_4$ gas as an etching gas.

Then, as the third step, the lower layer is dry etched. This operation is carried out by oxygen plasma etching using the pattern of the above-mentioned intermediate layer resist composition film as a mask, thereby forming a micro pattern having a high aspect ratio. The etching of the organic polymer film by this oxygen plasma etching is the same technique as plasma etching utilized in separation of a resist film carried out after the termination of the conventional etching processing of a substrate by the photoetching operation. This operation can be carried out with a cylindrical plasma etching apparatus by using a reactive gas, that is to say, an oxygen gas as an etching gas. A mixed gas of an oxygen gas with a gas such as a sulfurous gas can also be used.

EXAMPLES

Examples and a comparative example will be shown below, but are not to be construed to limit the scope of the invention.

Synthesis Example 1 Synthesis of (A-1)

(1) Synthesis of Macromer:

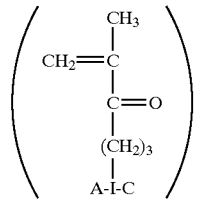

The above-mentioned macromer was synthesized based on a method described in Macromolecules, 28, 8435–8437 (1995) and J. Am. Chem. Soc., 112, 1931 (1990). A-I-C means a group represented by general formula (A-I) in which all $R_1$'s are isobutyl groups.

(2) Synthesis of (A-I)

The above-mentioned macromer (11.32 g) and 1.54 g of PEES (having the following structure) were added to 34.8 g of propylene glycol monomethyl ether acetate, and then, heated at 70° C. in a stream of nitrogen. When the reaction temperature was stabilized, an initiator (V-65, manufactured by Wako Pure Chemical Industries, Ltd.) was added in an amount of 3.3 mol % based on the total moles of the above-mentioned monomer three times every 2 hours, and finally allowed to react for 5 hours. a reaction mixture was poured into 2.0 liters of ultrapure water to precipitate a powder. After drying, the resulting resin was dissolved in 90 ml of methyl ethyl ketone. 4-N hydrochloric acid was added thereto, followed by heating under reflux for 6 hours to perform hydrolysis. Then, the resulting solution was added dropwise to 1.5 liters of ultrapure water with vigorous stirring to conduct reprecipitation. This precipitation operation was repeated three times. The resulting resin was dried in a vacuum dryer at 120° C. for 12 hours to obtain resin (A-1). The weight average molecular weight of resin (A-1) thus obtained was 17,000.

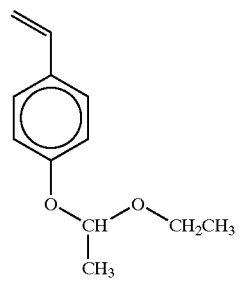

[PEES]

Similarly, polymers of (A-2) to (A-16) were obtained.

Examples 1 to 16 and Comparative Example 1

(1) Formation of Lower Resist Layer

An FHi-028DD resist (a resist for i-rays manufactured by FUJIFILM Olin Co., Ltd.) was applied onto a 6-inch silicon wafer with a Mark 8 spin coater manufactured by Tokyo Electron Ltd., and baked at 90° C. for 90 seconds to obtain a uniform film having a thickness of 0.55 μm.

This was further heated at 200° C. for 3 minutes to obtain a lower resist layer having a thickness of 0.40 μm.

(2) Formation of Intermediate Layer

An intermediate layer composition solution having each composition shown in Table 1 was prepared, and the resulting solution was microfiltrated through a membrane filter having a pore size of 0.1 μm to obtain an intermediate layer composition.

The intermediate layer composition was similarly applied onto the above-mentioned lower resist layer, and heated at 200° C. for 5 minutes to obtain an intermediate layer having a thickness of 0.10 μm.

(3) Formation of Upper Resist Layer

An upper layer resist solution having the following composition was prepared, and the resulting solution was microfiltrated through a membrane filter having a pore size of 0.1 μm to obtain an upper layer resist composition.

The upper layer resist composition was similarly applied onto the above-mentioned intermediate layer, and heated at 120° C. for 90 seconds to obtain an upper resist layer having a thickness of 0.30 μm.

The wafer thus obtained was exposed using an ArF excimer stepper, 9300, manufactured by ISI, on which a resolution mask was mounted, while changing exposure.

Then, the wafer was heated in a clean room at 120° C. for 90 seconds, thereafter developed with a tetrahydroammonium hydroxide developing solution (2.38% by weight) for 60 seconds, rinsed with distilled water, and dried to obtain a pattern (upper layer pattern). The wafer having the above-mentioned upper layer pattern was etched (dry developed) by use of a parallel flat plate type reactive ion etching apparatus, DES-245R, manufactured by Plasma System Corporation to form a pattern on the intermediate layer. The etching gas was $CHF_3$, the pressure was 30 mTorr, and the application power was 100 mW/cm². The pattern formed was observed under a scanning electron microscope.

[Preparation of Upper Layer Resist Solution]

Polymer: 11.6 g

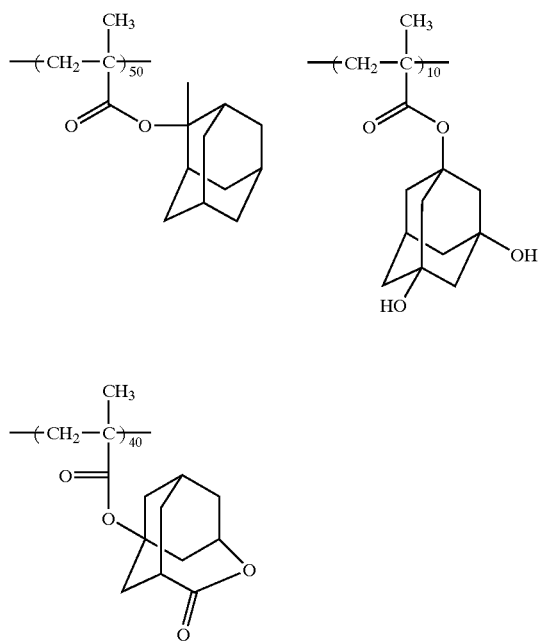

Weight average molecular weight: 19,000
Acid Generating Agent: 0.36 g

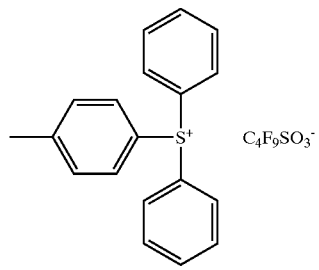

Basic Compound: 0.024 g
   1,5-Diazabicyclo[4.3.0]nona-5-ene
Surfactant: 0.01 g
   Megafac F-176 (manufactured by Dainippon Ink & Chemicals Inc.)
Solvent: 88 g
   Propylene glycol monomethyl ether acetate The cross-sectional shape of the upper layer pattern and line edge roughness (LER) after etching of the intermediate layer using the upper layer pattern as a mask were evaluated by the following methods:

(1) Cross-Sectional Shape of Upper Layer Pattern

After patterning of the upper layer resist, the cross-sectional shape of the pattern was observed (S-4200 manufactured by Hitachi, Ltd.).

(2) Separation Phenomenon of Upper layer Pattern

After patterning of the upper layer resist, the separation phenomenon of the upper layer pattern was observed (S-9200 manufactured by Hitachi, Ltd.).

The separation phenomenon of the upper layer pattern was not observed: Good

The separation phenomenon of the upper layer pattern was observed: Poor (3) Line Edge Roughness (LER)

After etching of the intermediate layer, the size of 120-nm lines (line/space=1/1) was measured (point of measurement: 30 points) at different positions (50 positions) on the 6-inch silicon wafer surface (S-9200 manufactured by Hitachi, Ltd.), and the dispersion of "found values —120 nm" was determined, followed by calculation of 3 σ. The smaller this value is, the better the LER is.

(4) Storage Stability of Coating Solution for Intermediate Layer

The rate of change in film thickness immediately after the preparation of the coating solution for the intermediate layer and after the storage thereof at 40° C. for 1 week (an accelerated test) was measured. The smaller the rate of change (%) is, the better the storage stability is.

Component (B), component (C), component (D), component (E) and component (F) used herein are shown below. An intermediate layer used in Comparative Example 1 is also described together.

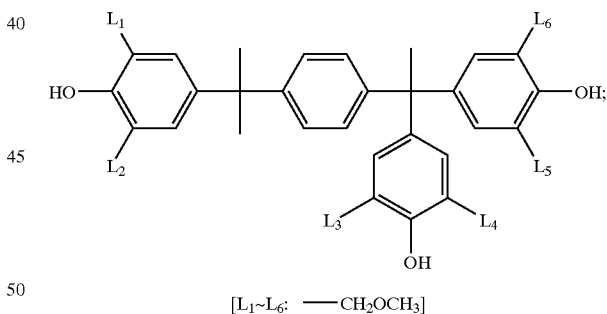

B-1

[$L_1$~$L_6$: —$CH_2OCH_3$]

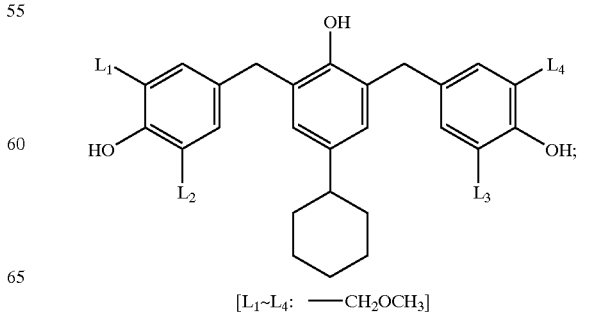

B-2

[$L_1$~$L_4$: —$CH_2OCH_3$]

B-3

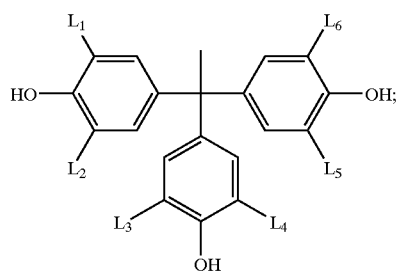

[L₁~L₆: —CH₂OCH₃]

B-4

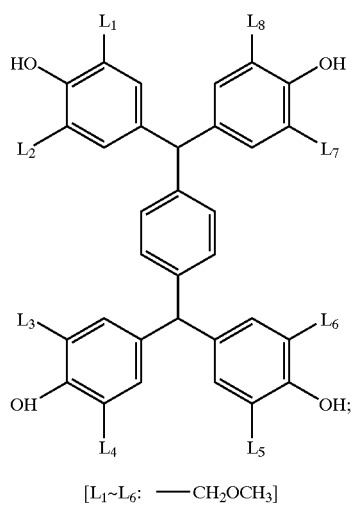

[L₁~L₆: —CH₂OCH₃]

B-5

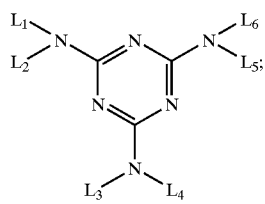

[L₁~L₆: —CH₂OCH₃]

B-6

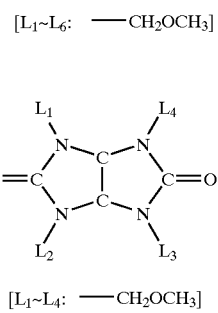

[L₁~L₄: —CH₂OCH₃]

C-1

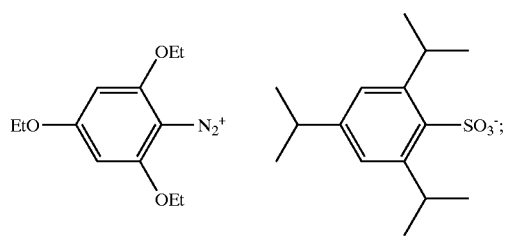

C-2

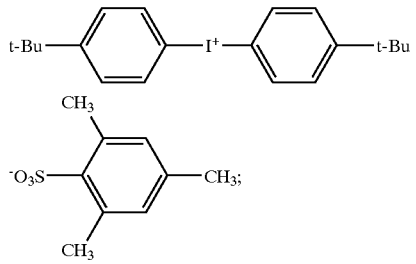

C-3

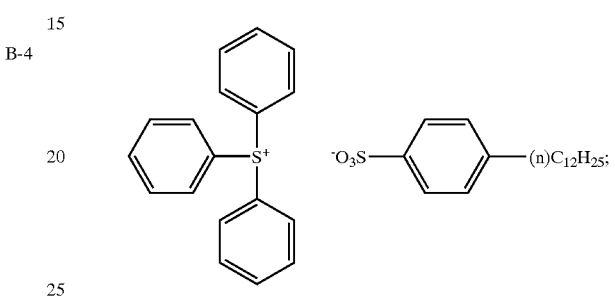

C-4

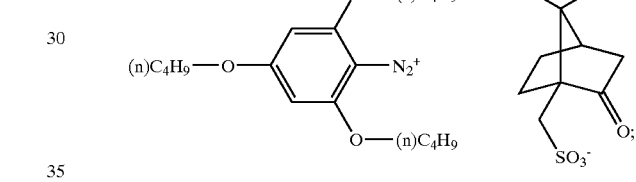

D-1: Propylene glycol monomethyl ether acetate
D-2: 2-Heptanone
D-3: Cyclohexanone
D-4: Methyl methoxypropionate
D-5: Butyl acetate
E-1: Megafac R08 (manufactured by Dainippon Ink & Chemicals Inc.)

[Intermediate Layer Used in Comparative Example 1]

An intermediate layer used in Comparative Example 1 was prepared according to a method described in Japanese Patent No. 2,901,044. The others were evaluated in the same manner as with Examples.

<Preparation of Coating Solution for Intermediate Layer of Comparative Example 1>

The following compound having an Mw of 20,000: 19 g

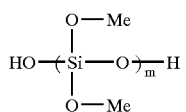

Acid generating agent: 0.825 g

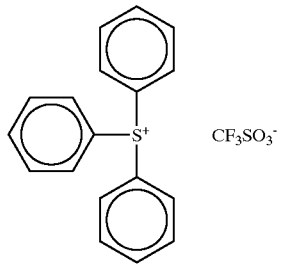

Monochlorobenzene: 178 g

The coating solution for the intermediate layer of Comparative Example 1 was applied onto the lower resist layer in the same manner as with Examples, and then, the evaluations were made in the same manner as with Examples with the exception that exposure was conducted with an Xe—Hg lamp for 5 minutes.

TABLE 1

| Example | Component A | Component B | Component C | Component D | Component E |
|---|---|---|---|---|---|
| 1 | A-2 (1.0 g) | B-1 (0.15 g) | C-1 (0.05 g) | D-1 (19 g) | E-1 (0.006 g) |
| 2 | A-5 (1.0 g) | B-2 (0.15 g) | C-2 (0.05 g) | D-2 (19 g) | — |
| 3 | A-1 (1.0 g) | B-1 (0.15 g) | C-3 (0.05 g) | D-3 (19 g) | E-1 (0.006 g) |
| 4 | A-3 (1.0 g) | B-1 (0.15 g) | C-1 (0.05 g) | D-4 (19 g) | — |
| 5 | A-7 (1.0 g) | B-5 (0.15 g) | C-2 (0.05 g) | D-5 (19 g) | E-1 (0.002 g) |
| 6 | A-4 (1.0 g) | B-3 (0.15 g) | C-3 (0.05 g) | D-1 (19 g) | — |
| 7 | A-6 (1.0 g) | B-1 (0.15 g) | C-1 (0.05 g) | D-1 (19 g) | E-1 (0.004 g) |
| 8 | A-8 (1.0 g) | B-4 (0.15 g) | C-1 (0.05 g) | D-2 (19 g) | — |
| 9 | A-10 (1.0 g) | B-6 (0.15 g) | C-4 (0.05 g) | D-3 (19 g) | E-1 (0.006 g) |
| 10 | A-11 (1.0 g) | B-1 (0.15 g) | C-2 (0.05 g) | D-1 (19 g) | — |
| 11 | A-9 (1.0 g) | B-2 (0.15 g) | C-3 (0.05 g) | D-5 (19 g) | E-1 (0.006 g) |
| 12 | A-13 (1.0 g) | B-1 (0.15 g) | C-4 (0.05 g) | D-1 (19 g) | — |
| 13 | A-16 (1.0 g) | B-5 (0.15 g) | C-1 (0.05 g) | D-5 (19 g) | E-1 (0.006 g) |
| 14 | A-12 (1.0 g) | B-3 (0.15 g) | C-2 (0.05 g) | D-2 (19 g) | — |
| 15 | A-14 (1.0 g) | B-4 (0.15 g) | C-3 (0.05 g) | D-3 (19 g) | E-1 (0.006 g) |
| 16 | A-15 (1.0 g) | B-1 (0.15 g) | C-4 (0.05 g) | D-4 (19 g) | — |

Comparative Example 1

The coating solution for the intermediate layer composed of poly(dimethoxysiloxane) and the acid generating agent.

TABLE 2

| Example | Storage Stability of Coating Solution for Intermediate Layer | Shape of Upper Layer Resist Pattern | Pattern Separation of Upper Layer Resist | LER after Etching of Intermediate Layer (nm) |
|---|---|---|---|---|
| 1 | 0.9% | Rectangular | Good | 2 |
| 2 | 0.7% | Rectangular | Good | 3 |
| 3 | 0.8% | Rectangular | Good | 3 |
| 4 | 0.6% | Rectangular | Good | 4 |
| 5 | 1.7% | Rectangular | Good | 10 |
| 6 | 0.9% | Rectangular | Good | 3 |
| 7 | 0.7% | Rectangular | Good | 2 |
| 8 | 0.9% | Rectangular | Good | 5 |
| 9 | 1.9% | Rectangular | Good | 8 |
| 10 | 1.0% | Rectangular | Good | 7 |
| 11 | 1.1% | Rectangular | Good | 6 |
| 12 | 1.0% | Rectangular | Good | 10 |
| 13 | 2.1% | Rectangular | Good | 5 |

TABLE 2-continued

| Example | Storage Stability of Coating Solution for Intermediate Layer | Shape of Upper Layer Resist Pattern | Pattern Separation of Upper Layer Resist | LER after Etching of Intermediate Layer (nm) |
|---|---|---|---|---|
| 14 | 1.2% | Rectangular | Good | 5 |
| 15 | 1.1% | Rectangular | Good | 7 |
| 16 | 1.0% | Rectangular | Good | 4 |

TABLE 2-continued

| Example | Storage Stability of Coating Solution for Intermediate Layer | Shape of Upper Layer Resist Pattern | Pattern Separation of Upper Layer Resist | LER after Etching of Intermediate Layer (nm) |
|---|---|---|---|---|
| Comparative Example 1 | 16% | Footing shape | Poor | 28 |

Evaluation Results of Examples 1 to 16 and Comparative Example 1 reveal the following.

That is to say, the intermediate layer material composition for a multilayer resist process of the invention and the pattern formation method using the same are excellent in storage stability of the coating solution for the intermediate layer and also capable of extremely excellent performance in terms of the shape of the upper layer resist pattern, pattern separation and the LER after etching of the intermediate layer, compared to the comparative example.

According to the invention, there are provided the intermediate layer material composition for a multilayer resist process which is soluble in an organic solvent, excellent in storage stability, and has no problem with regard to a footing shape, pattern separation and line edge roughness in patterning the upper resist, and the pattern formation method using the intermediate layer material composition.

The entire disclosure of each and every foreign patent application: Japanese Patent Application No. 2002-256737, from which the benefit of foreign priority has been claimed in the present application is incorporated herein by reference, as if fully set forth.

What is claimed is:

1. An intermediate layer material composition for a multilayer resist process, comprising (A) a polymer containing a repeating unit having on a side chain thereof a group represented by the following general formula (A-I) and at least one of a repeating unit represented by the following general formula (A-II) and a repeating unit represented by the following general formula (A-III):

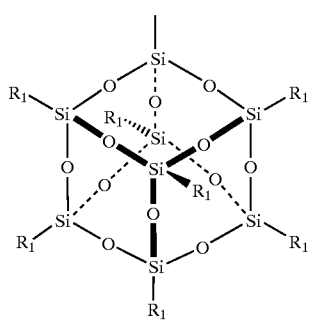

(A-I)

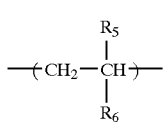

(A-II)

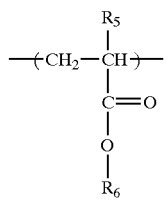

(A-III)

wherein $R_1$ represents an alkyl group, an alkoxyl group, an aryl group, an aralkyl group, a cyclopentyl group or a cyclohexyl group; a plurality of $R_1$'s each may be the same or different; $R_5$ represents a hydrogen atom or a methyl group; $R_6$ represents an aryl group or an aralkyl group.

2. The intermediate layer material composition described in claim 1, wherein the polymer is a polymer having at least one of repeating units represented by the following general formulas (a-1) to (a-4):

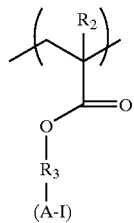

(a-1)

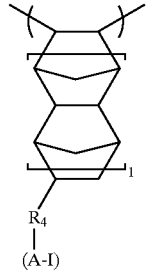

(a-2)

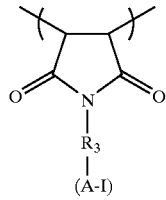

(a-3)

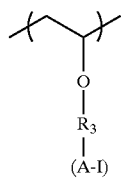

(a-4)

wherein (A-I) represents the group represented by the general formula (A-I) described in claim 1; $R_2$ represents a hydrogen atom or a methyl group; $R_3$ represents an alkylene group or a phenylene group; $R_4$ represents an alkylene group, a phenylene group or —C(=O)—O—R'—; R' represents an alkylene group.

3. The intermediate layer material composition described in claim 1, wherein the polymer contains the repeating unit having on a side chain thereof the group represented by the following general formula (A-I) in an amount of 3 to 90 mol %.

4. The intermediate layer material composition described in claim 1, which further comprises (B) a crosslinking agent.

5. The intermediate layer material composition described in claim 4, wherein the crosslinking agent (B) is a phenol derivative having a molecular weight of 1,200 or less, containing 3 to 5 benzene rings in its molecule, and having 2 or more hydroxymethyl groups or alkoxymethyl groups in total, wherein the hydroxymethyl groups or alkoxymethyl groups bind to the benzene rings.

6. The intermediate layer material composition described in claim 1, which further comprises (C) a compound capable of generating an acid by heat.

7. The intermediate layer material composition described in claim 1, which further comprises (D) a solvent.

8. The intermediate layer material composition described in claim 1, which further comprises (E) a surfactant.

9. A process for forming a resist pattern, which comprises:

forming on a substrate a lower resist layer comprising an organic material;

forming on the lower resist layer an intermediate layer using the intermediate layer material composition described in claim 1;

forming on the intermediate layer an upper resist layer comprising an organic material crosslinkable or decomposable by a radiation exposure;

forming a predetermined pattern on the upper resist layer; and etching the intermediate layer, the lower resist layer and the substrate, sequentially.

10. The process described in claim 9, wherein the intermediate layer is formed by coating the intermediate layer material composition described in claim 1 on the lower resist layer, and then baking the coating to be insolubilized in an organic solvent.

11. The process described in claim 10, wherein the coating is baked at a temperature of 150 to 250° C.

12. The process described in claim 9, wherein the lower resist layer has a thickness of 0.1 to 4.0 μm.

13. The process described in claim 9, wherein the intermediate layer has a thickness of 0.02 to 0.6 μm.

14. The process described in claim 9, wherein the upper layer has a thickness of 0.03 to 0.6 μm.

15. An intermediate layer material composition for a multilayer resist process, comprising (A) a polymer containing a repeating unit having on a side chain thereof a group represented by the following general formula (A-I) and (B) a crosslinking agent:

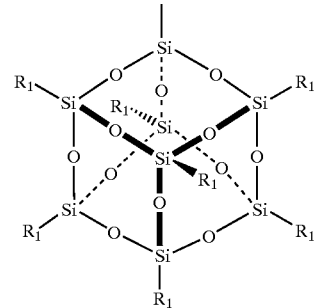

(A-I)

wherein $R_1$ represents an alkyl group, an alkoxyl group, an aryl group, an aralkyl group, a cyclopentyl group or a cyclohexyl group; a plurality of $R_1$'s each may be the same or different.

16. The intermediate layer material composition described in claim 15, wherein the polymer is a polymer having at least one of repeating units represented by the following general formulas (a-1) to (a-4):

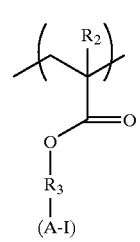

(a-1)

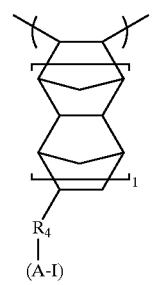

(a-2)

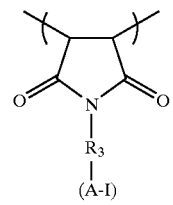

(a-3)

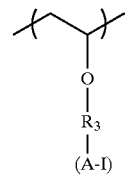

(a-4)

wherein (A-I) represents the group represented by the general formula (A-I) described in claim 1; $R_2$ represents a hydrogen atom or a methyl group; $R_3$ represents an alkylene group or a phenylene group; $R_4$ represents an alkylene group, a phenylene group or —C(=O)—O—R'—; R' represents an alkylene group.

17. The intermediate layer material composition described in claim 15, wherein the polymer further contains at least one of a repeating unit represented by the following general formula (A-II) and a repeating unit represented by the following general formula (A-III):

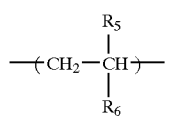
(A-II)

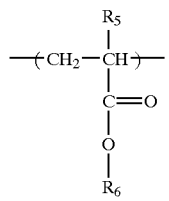
(A-III)

wherein $R_5$ represents a hydrogen atom or a methyl group; $R_6$ represents an aryl group or an aralkyl group having 20 or less carbon atoms.

18. The intermediate layer material composition described in claim 15, wherein the polymer contains the repeating unit having on a side chain thereof the group represented by the following general formula (A-I) in an amount of 3 to 90 mol %.

19. The intermediate layer material composition described in claim 15, wherein the crosslinking agent (B) is a phenol derivative having a molecular weight of 1,200 or less, containing 3 to 5 benzene rings in its molecule, and having 2 or more hydroxymethyl groups or alkoxymethyl groups in total, wherein the hydroxymethyl groups or alkoxymethyl groups bind to the benzene rings.

20. The intermediate layer material composition described in claim 15, which further comprises (C) a compound capable of generating an acid by heat.

21. The intermediate layer material composition described in claim 15, which further comprises (D) a solvent.

22. The intermediate layer material composition described in claim 15, which further comprises (E) a surfactant.

23. A process for forming a resist pattern comprising:

(a) forming on a substrate a lower resist layer, (b) forming on the lower resist layer an intermediate layer using the intermediate layer material composition described in claim 1; and (c) forming on the intermediate layer an upper resist layer.

24. The process for forming a resist pattern described in claim 23, wherein the polymer is a polymer having at least one of repeating units represented by the following general formulas (a-1) to (a-4):

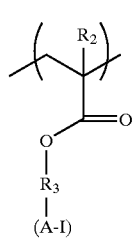
(a-1)

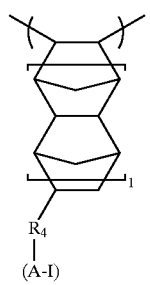
(a-2)

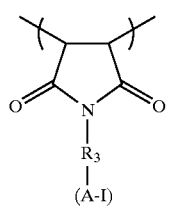
(a-3)

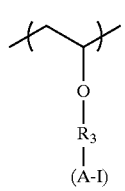
(a-4)

wherein (A-I) represents the group represented by the general formula (A-I) described in claim 1; $R_2$ represents a hydrogen atom or a methyl group; $R_3$ represents an alkylene group or a phenylene group; $R_4$ represents an alkylene group, a phenylene group or —C(=O)—O—R'—; R' represents an alkylene group.

25. The process for forming a resist pattern described in claim 23, wherein the polymer further contains at least one of a repeating unit represented by the following general formula (A-II) and a repeating unit represented by the following general formula (A-III):

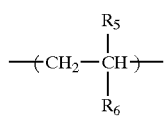
(A-II)

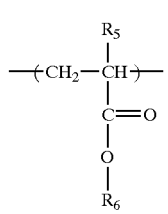
(A-III)

wherein $R_5$ represents a hydrogen atom or a methyl group; $R_6$ represents an aryl group or an aralkyl group.

26. The process for forming a resist pattern described in claim 23, wherein the polymer contains the repeating unit having on a side chain thereof the group represented by the following general formula (A-I) in an amount of 3 to 90 mol %.

27. The process for forming a resist pattern described in claim 23, which further comprises (B) a crosslinking agent.

28. The process for forming a resist pattern described in claim 27, wherein the crosslinking agent (B) is a phenol derivative having a molecular weight of 1,200 or less, containing 3 to 5 benzene rings in its molecule, and having 2 or more hydroxymethyl groups or alkoxymethyl groups in total, wherein the hydroxymethyl groups or alkoxymethyl groups bind to the benzene rings.

29. The process for forming a resist pattern described in claim 23, which further comprises (C) a compound capable of generating an acid by heat.

30. The process for forming a resist pattern described in claim 23, which further comprises (D) a solvent.

31. The process for forming a resist pattern described in claim 23, which further comprises (E) a surfactant.

* * * * *